United States Patent
Suzuki et al.

(10) Patent No.: US 10,020,821 B2
(45) Date of Patent: Jul. 10, 2018

(54) ENCODER, DECODER, TRANSMISSION DEVICE, AND RECEPTION DEVICE

(71) Applicant: NIPPON HOSO KYOKAI, Shibuya-ku, Tokyo (JP)

(72) Inventors: Youichi Suzuki, Tokyo (JP); Akinori Hashimoto, Tokyo (JP); Shoji Tanaka, Tokyo (JP); Kenichi Tsuchida, Tokyo (JP); Takeshi Kimura, Tokyo (JP); Yoshifumi Matsusaki, Tokyo (JP)

(73) Assignee: NIPPON HOSO KYOKAI, Shibuya-ku, Tokyo (JP)

( * ) Notice: Subject to any disclaimer, the term of this patent is extended or adjusted under 35 U.S.C. 154(b) by 16 days.

(21) Appl. No.: 15/035,548

(22) PCT Filed: Nov. 13, 2014

(86) PCT No.: PCT/JP2014/005715
§ 371 (c)(1),
(2) Date: May 10, 2016

(87) PCT Pub. No.: WO2015/072145
PCT Pub. Date: May 21, 2015

(65) Prior Publication Data
US 2016/0294417 A1 Oct. 6, 2016
US 2017/0302296 A9 Oct. 19, 2017

(30) Foreign Application Priority Data

Nov. 15, 2013 (JP) .................................. 2013-236956

(51) Int. Cl.
*H03M 13/11* (2006.01)
*H04L 1/00* (2006.01)
(Continued)

(52) U.S. Cl.
CPC ..... *H03M 13/1177* (2013.01); *H03M 13/036* (2013.01); *H03M 13/1165* (2013.01);
(Continued)

(58) Field of Classification Search
None
See application file for complete search history.

(56) References Cited

U.S. PATENT DOCUMENTS 9,564,990 B1 * 2/2017 Tiruvur ................. H04L 1/0041
9,762,262 B2 * 9/2017 Ashikhmin ....... H03M 13/1575
(Continued)

FOREIGN PATENT DOCUMENTS

JP 2008263566 A 10/2008
JP 4688841 B2 5/2011
(Continued)

OTHER PUBLICATIONS

Feb. 3, 2015, International Search Report issued in the International Patent Application No. PCT/JP2014/005715.
(Continued)

*Primary Examiner* — Mujtaba M Chaudry
(74) *Attorney, Agent, or Firm* — Kenia IP Law PC

(57) ABSTRACT

A transmission device and reception device for digital data that have excellent resistance to noise are provided. An encoder (11-1) of this disclosure, included in a transmission device (1) of this disclosure, applies LDPC encoding to digital data using a unique check matrix for each code rate by using a check matrix in which, taking a check matrix initial value table established in advance for each code rate at a code length of 44880 bits as initial values, 1 entries of a partial matrix corresponding to an information length appropriate for a code rate of 93/120 are allocated in the column direction over a cycle of 374 columns. A demodulator (23) of this disclosure, included in a reception device
(Continued)

(2) of this disclosure, decodes digital data encoded by the encoder (11-1).

4 Claims, 28 Drawing Sheets

(51) Int. Cl.
| | |
|---|---|
| *H03M 13/00* | (2006.01) |
| *H03M 13/25* | (2006.01) |
| *H03M 13/03* | (2006.01) |
| *H03M 13/27* | (2006.01) |
| *H03M 13/29* | (2006.01) |
| *H03M 13/15* | (2006.01) |

(52) U.S. Cl.
CPC ..... *H03M 13/255* (2013.01); *H03M 13/2792* (2013.01); *H03M 13/616* (2013.01); *H03M 13/6356* (2013.01); *H04L 1/00* (2013.01); *H04L 1/0041* (2013.01); *H04L 1/0045* (2013.01); *H03M 13/1102* (2013.01); *H03M 13/152* (2013.01); *H03M 13/2906* (2013.01)

(56) References Cited

U.S. PATENT DOCUMENTS

| | | | | |
|---|---|---|---|---|
| 2007/0195894 A1* | 8/2007 | Shokrollahi | ......... | H04L 1/0041 375/242 |
| 2009/0138785 A1* | 5/2009 | Sakai | ............... | H03M 13/1102 714/790 |
| 2011/0191650 A1* | 8/2011 | Yokokawa | ......... | H03M 13/1137 714/752 |
| 2013/0058363 A1* | 3/2013 | Ghiasi | .................. | H04L 49/357 370/514 |
| 2013/0227378 A1* | 8/2013 | Yamamoto | ......... | H03M 13/033 714/776 |
| 2016/0112066 A1* | 4/2016 | Ashikhmin | ......... | G06N 99/002 714/785 |

FOREIGN PATENT DOCUMENTS

| | | |
|---|---|---|
| JP | 4856608 B2 | 1/2012 |
| JP | 2012-049734 A | 3/2012 |
| WO | 2009001860 A1 | 12/2008 |
| WO | 2009031529 A1 | 3/2009 |

OTHER PUBLICATIONS

Yoichi Suzuki, Ken'ichi Tsuchida, Yoshifumi Matsusaki et al., "ARIB Evaluation Tests of Transmission System for Ultra-High Definition Television Satellite Broadcasting", ITE Technical Report, Feb. 28, 2014, 38(14), pp. 33 to 38.

R. G Gallager, "Low Density Parity Check Codes," in Research Monograph series Cambridge, MIT Press, 1963.

Suzuki et al., "Design of LDPC codes for the Advanced Satellite Broadcasting System," The Journal of the Institute of Image Information and Television Engineers, vol. 62, No. 12, Dec. 1, 2008, pp. 1997-2004.

Association of Radio Industries and Businesses, "Transmission System for Advanced Wide Band Digital Satellite Broadcasting", ARIB STD-B44 Version 2.0, pp. 15, 24 to 26, 39 to 42, Jul. 31, 2014.

Working Group for Advanced Digital Satellite Broadcasting, "Draft Report on Transmission Channel Coding System for Advanced Digital Satellite Broadcasting (Technical Requirements)", Jun. 17, 2008, pp. 12, 17 to 19.

Yoichi Suzuki et al., "Study on design of LDPC code aiming at Super Hi-vision Satellite Broadcasting", Mar. 4, 2014, p. 306, The Institute of Electronics, Information and Communication Engineers.

English Translation: "Transmission System for Advanced Wide Band Digital Satellite Broadcasting Association of Radio Industries and Businesses", Jul. 31, 2014, XP055314241, Retrieved from the Internet: URL: http://www.arib.or.jp/english/html/overview/doc,/6-STD-B44v2_0-E1.pdf.

Jun. 16, 2017 Extended European Search Report issued by the European Patent Office in the corresponding European Patent Application No. 14862342.4.

* cited by examiner

FIG. 7

Display of row numbers of check matrix (partial matrix $H_A$) every 374 columns starting from 1st column
Row numbers of check matrix

| | | | | | | | | | |
|---|---|---|---|---|---|---|---|---|---|
| 1st column of $H_A$ | 521 | 781 | 2081 | 2419 | 3589 | 5877 | 6085 | 6267 | 6657 |
| 375th column of $H_A$ | 1769 | 2029 | 2315 | 5799 | 6215 | 7255 | 7281 | 7385 | 9361 |
| 749th column of $H_A$ | 547 | 651 | 1873 | 2159 | 2471 | 7671 | 8581 | 8659 | 8919 |
| 1123rd column of $H_A$ | 2107 | 3069 | 3953 | 4851 | 5851 | 8555 | 9113 | 8815 | 9049 |
| 1497th column of $H_A$ | 131 | 4935 | 5038 | 5565 | 6406 | 7515 | 7593 | 8074 | 7905 |
| 1871st column of $H_A$ | 495 | 1821 | 2705 | 3095 | 3485 | 7459 | 8452 | 8503 | 8841 |
| 2245th column of $H_A$ | 638 | 880 | 2073 | 2426 | 5014 | 6475 | 7307 | 8968 | 9179 |
| 2619th column of $H_A$ | 27 | 910 | 2731 | 3199 | 4915 | 7923 | 8061 | 9543 | 9595 |
| 2993rd column of $H_A$ | 869 | 3081 | 3396 | 4109 | 6137 | 6345 | 7320 | 7880 | 8619 |
| 3367th column of $H_A$ | 2226 | 1979 | 2178 | 4701 | 5331 | 6423 | 9738 | 9224 | 9491 |
| 3741st column of $H_A$ | 2353 | 2937 | 4337 | 3458 | 4496 | 4375 | 4889 | 9532 | 9725 |
| 4115th column of $H_A$ | 9138 | 1381 | 1809 | 1449 | 1535 | 4655 | 8303 | 8113 | 8269 |
| 4489th column of $H_A$ | 4855 | 7552 | 6470 | 8936 | 7994 | 7002 | 9233 | 9174 | 9647 |
| 4853rd column of $H_A$ | 1991 | 6823 | 3584 | 6083 | 6115 | 5899 | 7302 | 7463 | 8529 |
| 5237th column of $H_A$ | 2777 | 2603 | 2707 | 3615 | 3823 | 5123 | 6995 | 9153 | |
| 5611th column of $H_A$ | 573 | 1941 | 7936 | 7524 | 7112 | 7047 | 9023 | 9673 | |
| 5968th column of $H_A$ | 1892 | 1847 | 2689 | 7176 | 7661 | 8559 | 7801 | 9465 | |
| 6359th column of $H_A$ | 7764 | 7894 | 7957 | | | | | | |
| 6733rd column of $H_A$ | 3756 | 5481 | 8893 | | | | | | |
| | 3403 | 7657 | 8373 | | | | | | |
| | 3572 | 4670 | 4343 | | | | | | |
| | 8924 | 7853 | 8217 | | | | | | |
| | 4000 | | | | | | | | |

$h_{14,4}$

Illustration of check matrix initial value table
(code rate of 93/120)

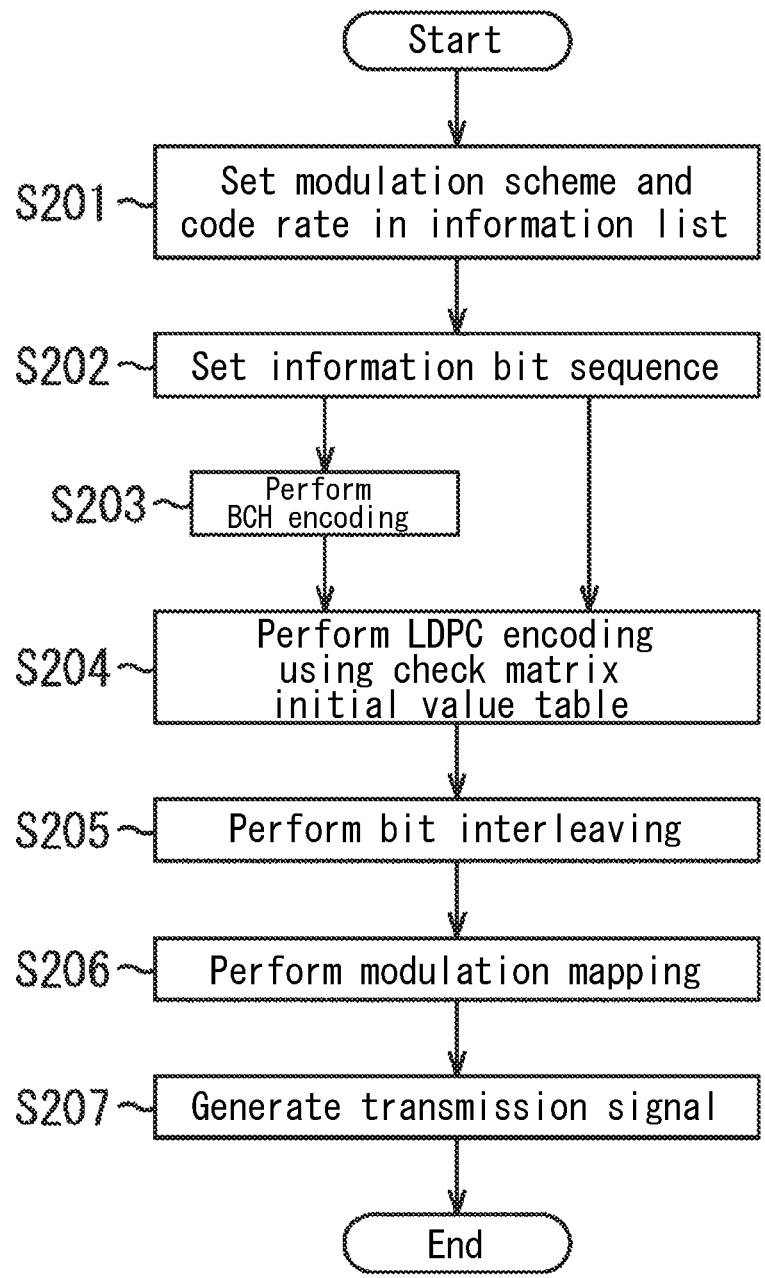

Structural diagram of bit interleaving for M-order modulation

FIG. 13

Specifications for LDPC code check matrix (93/120)

| Code length [bits] | 44,880 |
|---|---|
| Information length [bits] | 34,782 |
| Parity length [bits] | 10,098 |
| MPEG2-TS packet capacity (187 Bytes) | 23 packets |
| Check matrix maximum column weight | 9 |
| Check matrix average column weight | 3.6 |
| Check matrix average row weight | 16 |

FIG. 14

Bit interleaving when applying LDPC code check matrix for code rate of 93/120

| Modulation | Read direction of interleaving |
|---|---|
| 8PSK | Forward direction |
| 16APSK | Forward direction |
| 32APSK | Reverse direction |

16APSK:[C3 C2 C1 C0]

FIG. 17

Radius ratio in 16APSK when applying LDPC
code check matrix for code rate of 93/120

| Modulation | Radius ratio $\gamma$ |
|---|---|
| 16APSK | 2.87 |

FIG. 18

Radius ratio in 32APSK when applying LDPC
code check matrix for code rate of 93/120

| Modulation | Radius ratio $\gamma_1$ | Radius ratio $\gamma_2$ |
|---|---|---|
| 32APSK | 2.87 | 5.33 |

FIG. 24

List of required C/N

| Modulation scheme / code rate | Required C/N [dB] |
|---|---|
| π/2 shift BPSK 93/120 | 1.5 |
| QPSK 93/120 | 4.5 |
| 8PSK 93/120 | 8.6 |
| 16APSK 93/120 | 10.8 |
| 32APSK 93/120 | 13.4 |

ENCODER, DECODER, TRANSMISSION DEVICE, AND RECEPTION DEVICE

CROSS-REFERENCE TO RELATED APPLICATION

This application claims priority to and the benefit of Japanese Patent Application No. 2013-236956 filed Nov. 15, 2013, the entire contents of which are incorporated herein by reference.

TECHNICAL FIELD

This disclosure relates to the technical field of satellite and terrestrial broadcasting and of fixed and mobile communication. In particular, this disclosure relates to an encoder, decoder, transmission device, and reception device for digital data.

BACKGROUND

In a digital transmission system, a multilevel modulation scheme is often used to allow transmission of a larger amount of information in the frequency bandwidth that is usable for each service. In order to increase the frequency utilization efficiency, it is effective to increase the number of bits allocated per symbol of the modulation signal (modulation order), but the relationship between the upper limit on the rate of transferrable information at a frequency of 1 Hz and the signal-to-noise ratio is limited by the Shannon limit. Digital satellite broadcasting is one example of a form of information transfer using a satellite channel.

In digital satellite broadcasting, a Travelling-Wave Tube Amplifier (TWTA) with a good power efficiency is often used due to limitations on the hardware of the satellite transponder. For maximum utilization of the limited hardware in the satellite transponder, the amplifier is preferably caused to operate in the saturation region, so as to maximize the output of the satellite transponder. Distortion generated in the amplifier, however, leads to transmission degradation. Therefore, Phase Shift Keying (PSK) is often used as a modulation scheme having strong resistance to transmission degradation caused by distortion generated in the power amplifier. Currently, a transmission system called ISDB-S is used in Japan as a transmission system for digital satellite broadcasting, and PSK modulation such as BPSK, QPSK, or 8PSK can be used.

Amplitude Phase Shift Keying (APSK) can be used in DVB-S2, which is a European transmission system, and a modulation scheme that further improves the frequency utilization efficiency has been put into practical use. For example, transmission having a maximum of 4 bps/Hz as the frequency utilization efficiency is possible with 16APSK, and transmission having a maximum of 5 bps/Hz is possible with 32APSK.

In digital satellite broadcasting currently in use, information is corrected in a transmission device that uses an error-correcting code. By adding a redundant signal called parity bits to information that is to be transmitted, the redundancy (code rate) of the signal can be controlled, allowing the resistance to noise to be increased. Error-correcting codes and modulation schemes are closely related, and the theoretical upper limit on the frequency utilization efficiency with respect to the signal-to-noise ratio is called the Shannon limit. Low Density Parity Check (LDPC) codes were proposed by Gallager in 1962 as strong error-correcting codes that have the property of approaching the Shannon limit (for example, see R. G Gallager, "Low Density Parity Check Codes" (NPL 1)).

An LDPC code is a linear code defined by an extremely sparse check matrix H (a check matrix with entries of 0 and 1, in which the number of 1's is extremely small).

The LDPC code is a strong error-correcting code for which transmission characteristics approaching the Shannon limit are obtained by increasing the code length and using an appropriate check matrix. An LDPC code is used in DVB-S2, in the transmission system for advanced wide band digital satellite broadcasting described in ARIB STD-B44 (referred to below as the advanced satellite broadcasting system; for example, see the Transmission System for Advanced Wide Band Digital Satellite Broadcasting, ARIB Standard ARIB STD-B44 Version 1.0 (NPL 2)) and also in the IEEE802.16e Standard for Broadband Wireless Access. By combining multilevel APSK modulation with a strong error-correcting code, a representative example of which is an LDPC code, transmission at a higher frequency utilization efficiency is becoming possible.

Taking the advanced satellite broadcasting system as an example, the code length of the LDPC code in this system is 44880 bits, and the code is configured with a Forward Error Correction (FEC) frame. This code has been shown to exhibit performance within approximately 1 dB of the BPSK limit (the theoretical upper limit on the frequency utilization efficiency with respect to the signal-to-noise ratio when using BPSK in the constellation diagram) (for example, see Suzuki et al., "Design of LDPC codes for the Advanced Satellite Broadcasting System" (NPL 3)).

In the advanced satellite broadcasting system, 41/120 ($\approx$1/3), 49/120 ($\approx$2/5), 61/120 ($\approx$1/2), 73/120 ($\approx$3/5), 81/120 ($\approx$2/3), 89/120 ($\approx$3/4), 97/120 ($\approx$4/5), 101/120 ($\approx$5/6), 105/120 ($\approx$7/8), and 109/120 ($\approx$9/10) are established as the LDPC code rates (for example, see NPL 2). Apart from these, an LDPC code rate of 11/40 has been proposed (for example, see JP 4688841 B2 (PTL 1) and JP 4856608 B2 (PTL 2)).

CITATION LIST

Patent Literature

PTL 1: JP 4688841 B2
PTL 2: JP 4856608 B2

Non-Patent Literature

NPL 1: R. G Gallager, "Low Density Parity Check Codes," in Research Monograph series Cambridge, MIT Press, 1963
NPL 2: "Transmission System for Advanced Wide Band Digital Satellite Broadcasting, ARIB Standard ARIB STD-B44 Version 1.0," [online] Jul. 29, 2009, ARIB [retrieved Oct. 30, 2013], <URL:http://www.arib.or.jp/english/html/overview/doc/2-STD-B44v1#0.pdf>
NPL 3: Suzuki et al., "Design of LDPC codes for the Advanced Satellite Broadcasting System," The Journal of the Institute of Image Information and Television Engineers, Vol. 62, No. 12, Dec. 1, 2008, pp. 1997-2004

SUMMARY

Technical Problem

In order to increase the performance of an LDPC code, it is necessary not only to select a code rate, but also to establish a check matrix initial value table appropriate for each code rate, as shown in PTL 1 and 2. In particular, the gap between the required C/N when applying multilevel modulation to the LDPC code and the required C/N indicated by the Shannon limit (and by the limit of each modulation scheme) tends to widen. Therefore, when taking into consideration the adoption of 16APSK or 32APSK, for example, adopting an appropriate LDPC code rate and check matrix initial value table is an important technical issue in terms of improving the frequency utilization efficiency for the required C/N that is desired.

As described above, it would therefore be helpful to provide an encoder, decoder, transmission device, and reception device for digital data that improve the performance of an LDPC code when adopting multilevel modulation and that have excellent resistance to noise.

Solution to Problem

In the transmission device and reception device according to this disclosure, the encoder and decoder according to this disclosure include processing related to an LDPC code with an LDPC code rate of 93/120 and furthermore execute processing related to an LDPC code using a check matrix initial value table that effectively improves the characteristics of the LDPC code rate of 93/120. Furthermore, the transmission device and reception device of this disclosure respectively include, with respect to the LDPC code using the check matrix initial value table for the LDPC code rate of 93/120, a bit interleaver that operates by selectively controlling the bit read direction for each modulation scheme and a deinterleaver that operates by selectively controlling the bit write direction for each modulation scheme.

An encoder according to this disclosure applies LDPC encoding to digital data using a unique check matrix for each code rate, the encoder applying LDPC encoding by using a check matrix in which, taking a check matrix initial value table established in advance for each code rate at a code length of 44880 bits as initial values, 1 entries of a partial matrix corresponding to an information length appropriate for a code rate of 93/120 are allocated in a column direction over a cycle of 374 columns.

In the encoder according to this disclosure, the check matrix initial value table (Table 1) for the code rate of 93/120 is formed by the following tables.

TABLE 1

[Check Matrix Initial Value Table for Code Rate of 93/120]

| 521 | 781 | 2081 | 2419 | 3589 | 5877 | 6085 | 6267 | 6657 |
|---|---|---|---|---|---|---|---|---|
| 1769 | 2029 | 2315 | 5799 | 6215 | 7255 | 7281 | 7385 | 9361 |
| 547 | 651 | 1873 | 2159 | 2471 | 7671 | 8581 | 8659 | 8919 |
| 2107 | 3069 | 3953 | 4851 | 5851 | 8555 | 9113 | 8815 | 9049 |
| 131 | 4935 | 5038 | 5565 | 6406 | 7515 | 7593 | 8074 | 7905 |
| 495 | 1821 | 2705 | 3095 | 3485 | 7459 | 8452 | 8503 | 8841 |
| 638 | 880 | 2073 | 2426 | 5014 | 6475 | 7307 | 8968 | 9179 |
| 27 | 910 | 2731 | 3199 | 4915 | 7923 | 8061 | 9543 | 9595 |
| 869 | 3081 | 3396 | 4109 | 6137 | 6345 | 7320 | 7880 | 8619 |
| 2226 | 1979 | 2178 | 4701 | 5331 | 6423 | 9738 | 9224 | 9491 |
| 2353 | 2937 | 4337 | 3458 | 4496 | 4375 | 4889 | 9532 | 9725 |
| 9138 | 1381 | 1809 | 1449 | 1535 | 4655 | 8303 | 8113 | 8269 |
| 4855 | 7552 | 6470 | 8936 | 7994 | 7002 | 9233 | 9174 | 9647 |
| 1991 | 6823 | 3584 | 6083 | 6115 | 5899 | 7302 | 7463 | 8529 |
| 2777 | 2603 | 2707 | 3615 | 3823 | 5123 | 6995 | 9153 | |
| 573 | 1941 | 7936 | 7524 | 7112 | 7047 | 9023 | 9673 | |
| 1892 | 1847 | 2689 | 7176 | 7661 | 8559 | 7801 | 9465 | |
| 7764 | 7894 | 7957 | | | | | | |
| 3756 | 5481 | 8893 | | | | | | |

TABLE 1-continued

[Check Matrix Initial Value Table for Code Rate of 93/120]

| 3403 | 7657 | 8373 |
|---|---|---|
| 3572 | 4670 | 4343 |
| 8924 | 7853 | 8217 |
| 4000 | 6095 | 9101 |
| 1743 | 6759 | 7541 |
| 1249 | 7827 | 9439 |
| 3312 | 5833 | 7177 |
| 3017 | 5985 | 5773 |
| 497 | 5080 | 9231 |
| 1301 | 5407 | 4837 |
| 878 | 2598 | 2887 |
| 7100 | 5900 | 6605 |
| 2644 | 5537 | 8243 |
| 4601 | 5311 | 5253 |
| 6722 | 8930 | 9777 |
| 3332 | 4132 | 5227 |
| 8551 | 8991 | 9335 |
| 2419 | 2602 | 4421 |
| 5390 | 4626 | 8035 |
| 4110 | 5955 | 7879 |
| 2589 | 5643 | 6709 |
| 917 | 6697 | 8139 |
| 838 | 7638 | 9517 |
| 1230 | 2913 | 7619 |
| 2497 | 3519 | 5903 |
| 3307 | 4131 | 4577 |
| 5096 | 5435 | 7021 |
| 4121 | 7554 | 9621 |

TABLE 2

[Check Matrix Initial Value Table for Code Rate of 93/120 (cont'd)]

| 6742 | 5965 | 8945 |
|---|---|---|
| 6140 | 6781 | 8321 |
| 2452 | 6557 | 7697 |
| 5034 | 4842 | 9205 |
| 4057 | 5398 | 9309 |
| 2445 | 3982 | 8191 |
| 3641 | 8639 | 7775 |
| 4946 | 7418 | 8737 |
| 1862 | 1613 | 3147 |
| 7115 | 2965 | 5201 |
| 1405 | 6891 | 8763 |
| 915 | 1431 | 8971 |
| 5167 | 4965 | 5721 |
| 1926 | 1888 | 5461 |
| 2686 | 2165 | 7099 |
| 2802 | 2055 | 5539 |
| 1329 | 4737 | 9413 |
| 1660 | 469 | 1951 |
| 5124 | 9257 | 9387 |
| 3015 | 5560 | 7983 |
| 4083 | 4239 | 4785 |
| 3348 | 6541 | 8165 |
| 6843 | 6820 | 9803 |
| 7736 | 5291 | 6371 |
| 1880 | 5079 | 9699 |
| 79 | 2033 | 6189 |
| 5874 | 5487 | 7762 |
| 6655 | 9299 | 9075 |
| 6139 | 5381 | 7567 |
| 1406 | 5583 | 6839 |
| 4609 | 3306 | 5513 |
| 319 | 3991 | 6917 |
| 5989 | 8846 | 9569 |
| 4735 | 4497 | 4447 |
| 2814 | 6943 | 8633 |
| 5453 | 5702 | 6059 |
| 3708 | 5981 | 9751 |
| 6368 | 5169 | 7333 |
| 3369 | 8002 | 9283 |
| 2628 | 2838 | 5383 |
| 7740 | 5424 | 7645 |

TABLE 2-continued

[Check Matrix Initial Value Table for Code Rate of 93/120 (cont'd)]

| 2130 | 1372 | 3121 |
| 1608 | 5747 | 8997 |
| 7097 | 7238 | 8399 |
| 2816 | 5125 | 5409 |
| 649  | 1657 | 2835 |

A decoder according to this disclosure is configured to apply LDPC decoding, based on the check matrix, to data encoded by the encoder according to this disclosure.

A transmission device according to this disclosure comprises the encoder according to this disclosure.

The transmission device according to this disclosure may further comprise a bit interleaver configured to read data encoded by the encoder by reading in a forward direction when a modulation scheme is 8PSK and 16APSK and by reading in a reverse direction when the modulation scheme is 32APSK.

A reception device according to this disclosure comprises the decoder according to this disclosure.

A reception device according to this disclosure comprises a deinterleaver configured to write data encoded by the transmission device according to this disclosure by writing in the forward direction when the modulation scheme is 8PSK and 16APSK and by writing in the reverse direction when the modulation scheme is 32APSK; and a decoder configured to apply LDPC decoding, based on the check matrix, to data processed by the deinterleaver.

Advantageous Effect

According to this disclosure, at the required C/N that is desired, the performance of the LDPC code can be increased and the frequency utilization efficiency can be improved.

BRIEF DESCRIPTION OF THE DRAWINGS

In the accompanying drawings:

FIG. 7 illustrates a check matrix initial value table (code rate of 93/120) in the transmission system of one of the embodiments;

FIG. 8 is a flowchart for generation of a transmission signal in a transmission device of one of the embodiments;

FIG. 13 illustrates the specifications of the LDPC code check matrix for an LDPC code rate of 93/120 according to this disclosure;

FIG. 14 illustrates the read direction of bit interleaving when applying the LDPC code check matrix for the LDPC code rate of 93/120 according to this disclosure;

FIG. 17 illustrates a preferred example of the radius ratio when applying the LDPC code check matrix for the LDPC code rate of 93/120 in 16APSK according to this disclosure;

FIG. 18 illustrates a preferred example of the radius ratios when applying the LDPC code check matrix for the LDPC code rate of 93/120 in 32APSK according to this disclosure;

FIG. 24 illustrates the required C/N of different modulation schemes for the LDPC code rate of 93/120 according to this disclosure;

DETAILED DESCRIPTION

The following describes a transmission system according to one of the embodiments of this disclosure. The transmission system according to one of the embodiments of this disclosure is formed by a transmission device and a reception device. The transmission device includes an encoder and a modulator according to this disclosure, and the reception device includes a demodulator and a decoder according to this disclosure. In particular, in this disclosure, considering the case of sufficient transmission characteristics not being obtainable with only an existing LDPC code rate, a new LDPC code rate of 93/120 is established, and in association with deriving a check matrix initial value table (Table 1) effective for this LDPC code rate of 93/120, this disclosure optimizes bit interleaving, deinterleaving, and modulation mapping during multilevel modulation, such as 16APSK or 32APSK, that advantageously improves transmission characteristics. Note that while having similar functions to the devices disclosed in PTL 1 and 2, the transmission device and reception device of this disclosure differ in the following points: the encoder and decoder of this disclosure include processing related to an LDPC code with an LDPC code rate of 93/120; the encoder and decoder of this disclosure execute processing related to an LDPC code using a check matrix initial value table that effectively improves the characteristics of the LDPC code rate of 93/120; the transmission device and reception device of this disclosure respectively include, with respect to the LDPC code using the check matrix initial value table for the LDPC code rate of 93/120, a bit interleaver that operates by selectively controlling the bit read direction for each modulation scheme and a deinterleaver that operates by selectively controlling the bit write direction for each modulation scheme; and the modulator of the transmission device and the demodulator of the reception device according to this disclosure include mapping that, in accordance with the modulation scheme (in particular, multilevel modulation), selectively allocates modulation symbols at a radius ratio appropriate for the LDPC code using the check matrix initial value table for the LDPC code rate of 93/120.

(Transmission System)

First, the structure of the multiplex frame used in the transmission system of this embodiment is described.

(Structure of Multiplex Frame)

Figure 1:
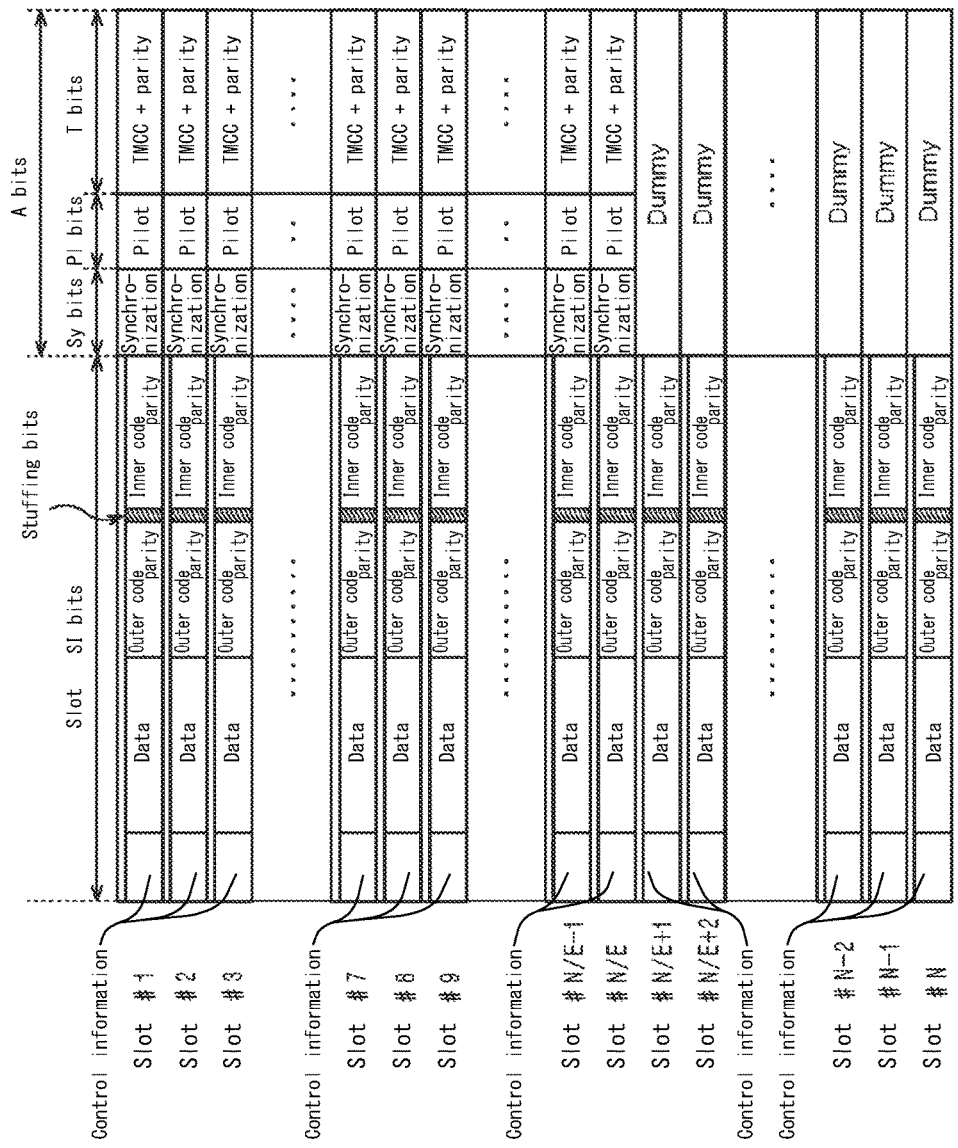
FIG. 1 illustrates the structure of the multiplex frame in the transmission system of one of the embodiments.

FIG. 1 illustrates the structure of the multiplex frame used by the multiple modulation/time division multiplexing transmission system of this embodiment. By using the multiplex frame structure illustrated in FIG. 1, the transmission device of one of the embodiments (see FIG. 2; details are provided below) designates the transmission system and the code rate and performs encoding and modulation. Based on this frame structure, the reception device of one of the embodiments (see FIG. 3; details are provided below) performs demodulation and decoding of the error-correcting code.

As illustrated in FIG. 1, in this multiplex frame structure, a slot is constituted by control information, data, outer code parity, stuffing bits, and inner code parity. The length is Sl bits, and the number of slots constituting one frame is N. Apart from the slots, the multiplex frame structure includes synchronization, pilot, and TMCC and its error correction parity. The respective lengths are Sy bits, Pl bits, and T bits, and in slots #1 to #N/E, the number of allocated bits is Sy×N/E, Pl×N/E, and T×N/E respectively.

The stuffing bits are bits that are inserted only as necessary in order to facilitate byte-by-byte processing. Therefore, stuffing bits are not inserted when there is no need to facilitate byte-by-byte processing. For example, assume that the number of bits that can be reserved for control information is 182, and that subsequent data continues for X bytes. In this case, since the 182 bit control information equals 22 bytes+six bits, attempting to process based on units of bytes requires the extra steps of shifting the subsequent data in units of bytes by two bits, connecting the data with the last six bits of the control information, and writing the result. On the receiving device side, it is necessary to restore this connection and reconstruct the original data in units of bytes. In such a case, among the bits usable for the control information, it is highly advantageous in terms of hardware implementation to set these six bits to stuffing bits that are not used to transmit information.

The multiplex frame structure according to this embodiment also includes inner code parity. Therefore, the rule for inserting dummy slots need only take into consideration the frequency utilization efficiency of the actual digital modulation scheme (also referred to simply as the modulation scheme).

Unlike a known multiplex frame structure, the number of dummy slots allocated to the modulation scheme to be used is determined without any dependence on the code rate, as described below. Note that information for controlling transmission (also referred to below as transmission control information) is written in the transmission control information (i.e. the TMCC signal) and has a value, corresponding to a transmission mode, that allows designation of the transmission mode for each slot. As used herein, the transmission mode can be designated as a combination of the modulation scheme and the inner code rate.

In FIG. 1, N indicates the number of slots per frame. The actual value of N is set so as to satisfy the bit rate per slot.

For example, in the transmission system to be configured, assume that the modulation schemes with maximum efficiency among the modulation scheme group are 8PSK (3 bps/Hz), 16APSK (or 16QAM, 4 bps/Hz), and 32APSK (or 32QAM, 5 bps/Hz), and that there are 48 slots at 2 bps/Hz. The modulation schemes are respectively 1.5 times, 2 times, and 2.5 times this rate, and hence it follows that the number of slots N is preferably 48 slots×1.5=72 slots, 48 slots×2=96 slots, and 48 slots×2.5=120 slots respectively.

The reason for providing Dummy areas below the area of the synchronization, the pilot, and the TMCC and its error correction parity is that with respect to the main signal transmitted with the modulation scheme with maximum efficiency among the adopted modulation scheme group, a modulation scheme with a generally low efficiency is often adopted. Since a corresponding extra number of modulation symbols are occupied, this portion of the time domain is set aside. The Dummy areas are virtual areas, and data in these areas is not actually transmitted. Hence, provision of a corresponding memory area is unnecessary. The value of E, which prescribes the size of the Dummy, is the ratio of the frequency utilization efficiency of the modulation scheme for transmitting these signals to the frequency utilization efficiency of the modulation scheme with maximum efficiency among the modulation scheme group. For example, when the modulation scheme with maximum efficiency among the adopted modulation scheme group is 32APSK (or 32QAM, 5 bps/Hz) and the modulation scheme for transmitting these signals is BPSK (1 bps/Hz), then the value of E is five. Similarly, when the modulation scheme with maximum efficiency among the modulation scheme group is 16APSK (or 16QAM, 4 bps/Hz) and the modulation scheme for transmitting these signals is BPSK (1 bps/Hz), then the value of E is four.

The slot length Sl depends on the length of the code (code length). As disclosed in PTL 1 and 2 and NPL 3, the slot length Sl is preferably 44880. The intent is for the sum of the number of bits in the control information, the outer code parity, and the stuffing bits to be an integer multiple of the period Mt (374) of the LDPC in order to allocate the data and the LDPC parity flexibly. Accordingly, so that the data in one slot can be efficiently processed byte-by-byte with a plurality of modulation schemes, the transmission device and reception device are described below for the case of dealing with a multiplex frame structure in which the slot length Sl is 44880.

Next, the transmission device of one of the embodiments is described.

(Transmission Device)

Figure 2:
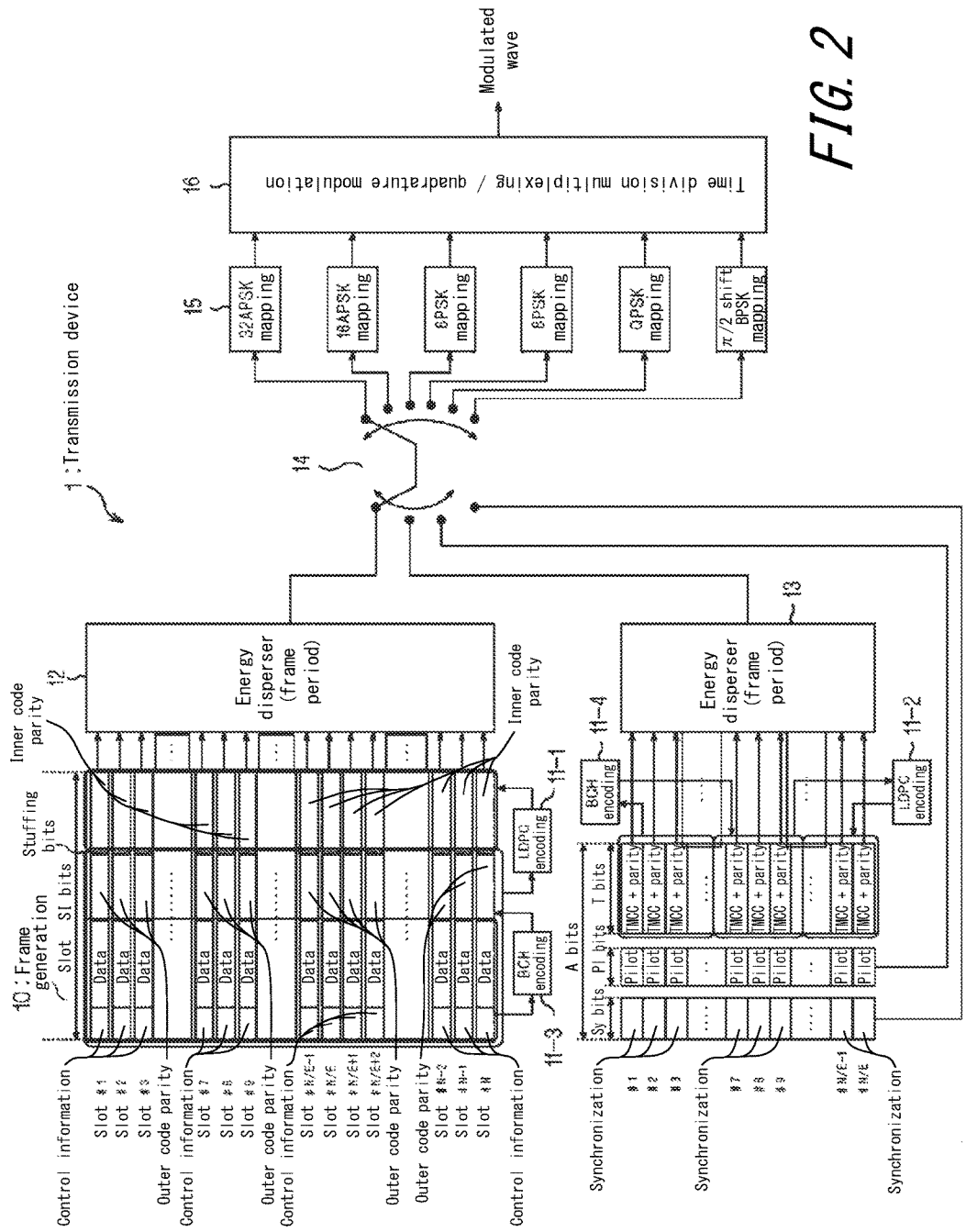
FIG. 2 is a block diagram of a transmission device in the transmission system of one of the embodiments.

FIG. 2 illustrates the structure of a transmission device 1 of one of the embodiments. The transmission device 1 includes a frame generator 10, LDPC encoders 11-1 and 11-2, BCH encoders 11-3 and 11-4, energy dispersers 12 and 13, a switch 14, a mapper 15, and a time division multiplexing/quadrature modulator 16. When transmitting a data stream, the transmission device 1 performs a sequence of processing from generation of the multiplex frame signal illustrated in FIG. 1 through generation of a modulated wave signal. Hereinafter, the LDPC encoders 11-1 and 11-2 are also simply referred to as encoders, and the processing block that uses the mapper 15 and the time division multiplexing/quadrature modulator 16 to modulate the symbols allocated by the mapper 15 is also simply referred to as a modulator.

For slot Sl bits, the frame generator 10 generates a frame composed of slots #1 to #N formed by a control information, data, outer parity in which the control information and the data are coded by the BCH encoder 11-3, stuffing bits, and inner parity yielded by the encoder 11-1 applying an LDPC code to the control information, data, outer parity, and stuffing bits. The frame generator 10 outputs the result to the energy disperser 12. For the TMCC signal, the frame generator 10 generates BCH parity with the BCH encoder 11-4 and furthermore generates LDPC parity with the encoder 11-2. The multiplex frame generated by the frame generator 10 is generated so that the number of slots N, the value E prescribing the size of the Dummy, the slot length Sl, the synchronization bit length Sy, the pilot bit length Pl, and the TMCC and parity bit length T conform to the above-mentioned numbers.

The BCH encoders 11-3 and 11-4 apply an error-correcting code provided as necessary as an outer code and apply a BCH code to predetermined data. The coding of the BCH code may be similar to the coding prescribed by NPL 2, and details thereof are omitted.

The encoders 11-1 and 11-2 apply LDPC encoding with period Mt to predetermined data or to BCH encoded data as an inner code. Details on the LDPC encoding using a check matrix by the encoders 11-1 and 11-2 of this disclosure are provided below.

The energy disperser 12 receives input of the slots #1 to #N generated by the frame generator 10 and performs energy dispersal (bit randomization) on the entire input data and the like. The energy dispersal is implemented by generating a pseudorandom pattern of "1" and "0" using an M-sequence and adding this pattern to the data in the slot, modulo 2. As a result, sequences of "1" or "0" are broken up, allowing stabilization of synchronous regeneration in the below-described reception device. A sufficient dispersal effect can also be expected when the parity bits added by the LDPC encoder 11-1 are calculated based on the signal after energy dispersal. Therefore, the order of the processing by the LDPC encoder 11-1 and the processing by the energy disperser 12 is reversible. In this case, the reception device also performs signal processing as a pair with the transmission device.

The energy disperser 13 receives input of predetermined control information #1 to #N/E corresponding to the slots generated by the frame generator 10 (the information in the T bits illustrated in FIG. 1) and performs energy dispersal (bit randomization) on the entire input data and the like together with the energy disperser 12. A sufficient dispersal effect can also be expected when the parity bits added by the LDPC encoder 11-2 are calculated based on the signal after energy dispersal. Therefore, the order of the processing by the LDPC encoder 11-2 and the processing by the energy disperser 13 is reversible. In this case, the reception device also performs signal processing as a pair with the transmission device.

While appropriately inserting synchronization and pilot signals, the switch 14 switches between slots #1 to #N in accordance with the various modulation schemes and performs mapping with the modulation scheme designated by the TMCC synchronization using the mapper 15.

The time division multiplexing/quadrature modulator 16 performs time division multiplexing frame-by-frame and applies quadrature modulation to generate a modulated wave signal.

Figure 4:
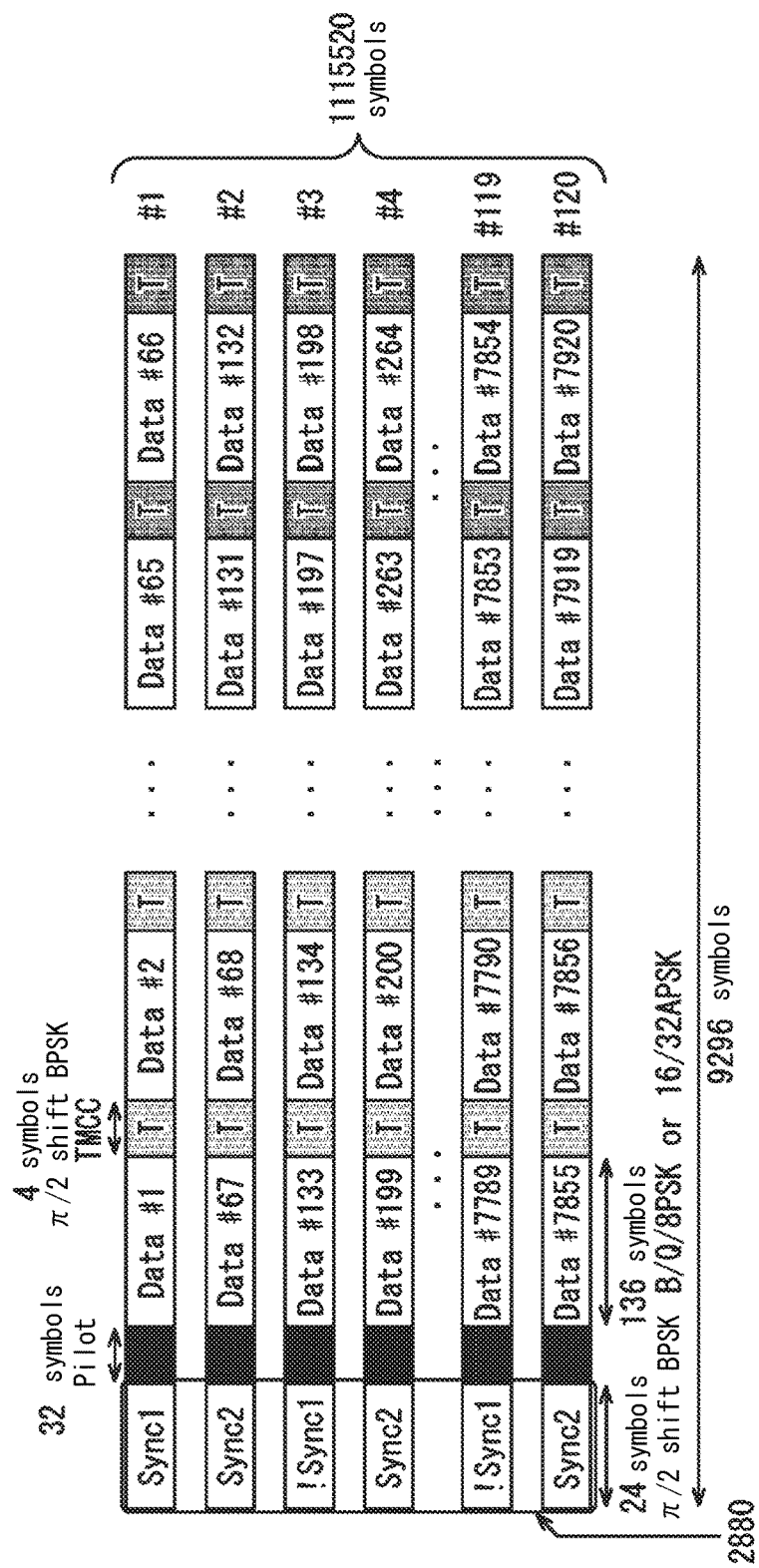
FIG. 4 illustrates an example of a modulated wave signal in one of the embodiments.

For example, when the modulation scheme with maximum efficiency is 32APSK (or 32QAM), N=120, E=5, Sl=44880, Sy=120, Pl=160, and T=1320, then the modulated wave signal is transmitted by dividing the information of one frame into modulation slots #1 to #120 (see FIG. 4). In the odd-numbered modulation slots, a slot synchronization Sync1 (24 symbols) subjected to $\pi/2$ shift BPSK modulation or the inverse pattern thereof !Sync1 (24 symbols) and a pilot signal (32 symbols) corresponding to the modulation scheme of the modulation slot are first transmitted. Next, the main signal data (136 symbols) having multiplexed therein video, voice, data broadcast, and the like modulated with the modulation scheme designated by the TMCC signal and a TMCC signal (4 symbols) subjected to $\pi/2$ shift BPSK modulation are alternately transmitted 66 times. In the even-numbered modulation slots, a slot synchronization Sync2 (24 symbols) subjected to $\pi/2$ shift BPSK modulation and a pilot signal (32 symbols) corresponding to the modulation scheme of the modulation slot are first transmitted. Next, the main signal data (136 symbols) having multiplexed therein video, voice, data broadcast, and the like modulated with the modulation scheme designated by the TMCC signal and a TMCC signal (4 symbols) subjected to $\pi/2$ shift BPSK modulation are alternately transmitted 66 times.

In order to avoid pseudo synchronization between the synchronization pattern Sync1, the inverse pattern thereof !Sync1, and Sync2, these patterns themselves need to have sharp autocorrelation peaks and low cross-correlation. As such codes, using 0x52f866=0101001011111000011001100 as Sync1, 0xad0799=1010110100000111100011001 as the bit inverse pattern thereof !Sync1, and 0x36715a=001101100111000101011010 as Sync2 allows reception with little pseudo synchronization.

By performing such processing repeatedly for 120 modulation slots, the information written in the TMCC signal is transmitted to the below-described reception device 2. By continually monitoring the information in the TMCC signal, the reception device 2 can change the reception scheme or the like in accordance with a variety of transmission controls that may be performed by the transmission device 1.

Next, the reception device of one of the embodiments is described.

(Reception Device)

Figure 3:
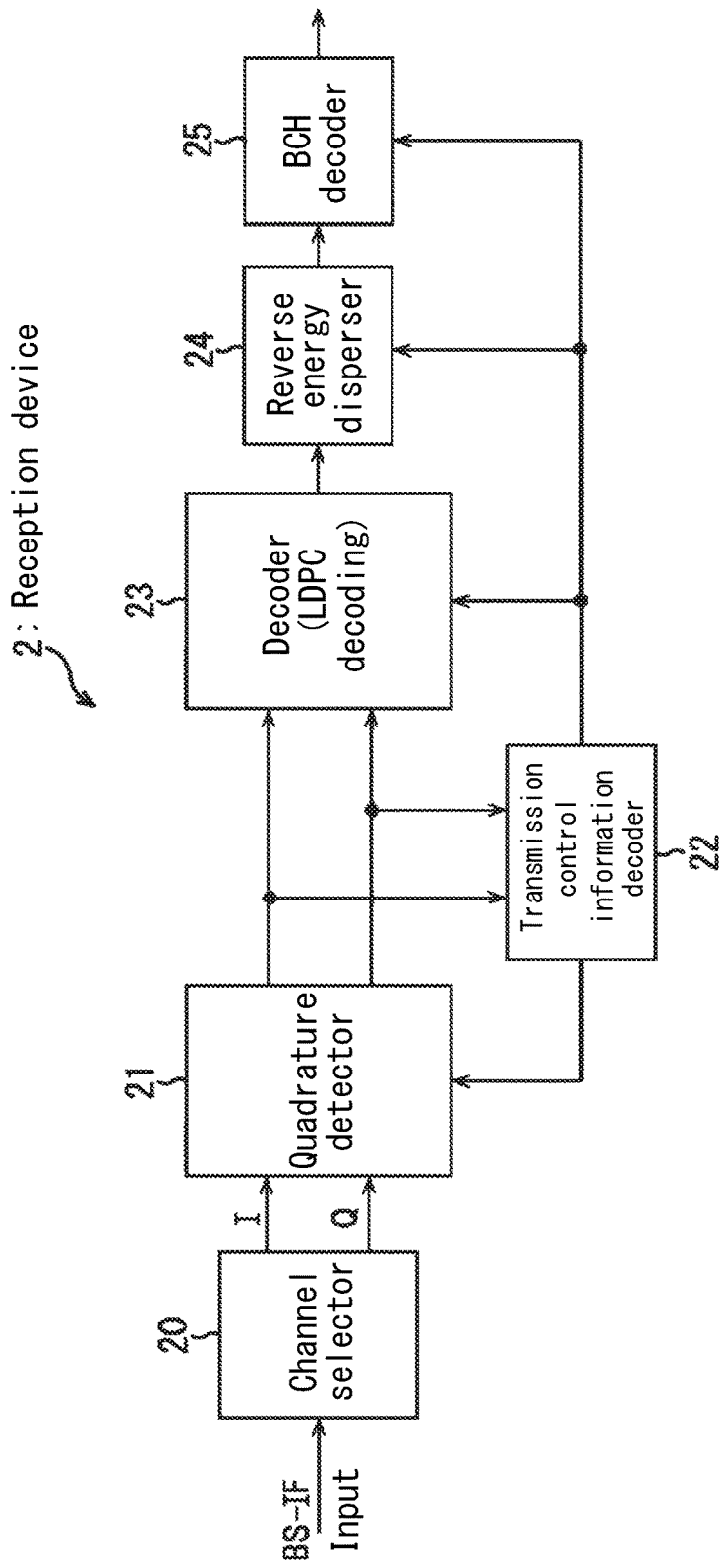
FIG. 3 is a block diagram of a reception device in the transmission system of one of the embodiments.

FIG. 3 illustrates the structure of the reception device 2 of one of the embodiments. The reception device 2 includes a channel selector 20, a quadrature detector 21, a transmission control information decoder 22, a decoder 23, a reverse energy disperser 24, and an outer code decoder (BCH decoder) 25.

The channel selector 20 receives a modulated wave signal from the transmission device 1, selects a channel at a predetermined frequency band, converts the signal of that channel into a baseband signal composed of an I component (In-phase) signal and a Q component (Quadrature-phase) signal handled by the quadrature detector 21, and outputs the result.

The quadrature detector 21 receives input of the baseband signal of the channel selected by the channel selector 20 and converts the input to a synchronized baseband signal.

The transmission control information decoder 22 receives input of the synchronized baseband signal converted by the quadrature detector 21, first detects the slot synchronization Sync2, next detects the frame synchronization !Sync1 and Sync1, and then using these as a reference, also detects the position of the TMCC signal, which is a cyclically multiplexed π/2 shift BPSK modulated wave. At this point, the transmission control information decoder 22 also detects information, transmitted by the TMCC signal, on the modulation scheme and error correction. The information decoded by the transmission control information decoder 22 is input into the quadrature detector 21, decoder 23, reverse energy disperser 24, and outer code decoder 25.

The decoder 23 is configured as an LDPC decoder, receives input of the synchronized baseband signal from the quadrature detector 21, receives input of the information on the modulation scheme and error correction detected by the transmission control information decoder 22, and performs decoding in accordance with each modulation scheme. Details on the LDPC decoding using a check matrix by the decoder 23 of this disclosure are provided below.

In order to reverse the processing by which a pseudorandom code was added modulo 2 in the energy dispersers 12 and 13 of the transmission device 1, the reverse energy disperser 24 once again adds the same pseudorandom code modulo 2 to perform reverse energy dispersal.

The outer code decoder 25 decodes the signals that were coded, for example by BCH encoding, in the outer code encoders 11-3 and 11-4 of the transmission device 1.

In this way, in one of the embodiments, the transmission device 1 and the reception device 2 also support an error-correcting code such as LDPC that has a long code length and allow the modulation scheme and the code rate to be combined freely. Accordingly, MPEG-2 TS and other digital data streams can be transmitted efficiently.

Next, in the above-described multiple modulation/time division multiplexing transmission system, the encoder and the decoder of this disclosure are described along with the processing by the transmission device and the reception device.

First, the processing by the encoders 11-1 and 11-2 of this embodiment is described.

(Processing by Encoders)

The code length N of the check matrix H is set to 44880. An LDGM structure is adopted for the check matrix H. $H=[H_A|H_B]$, and as the submatrix $H_A$, a matrix in which there are two types, large and small, of column weights for each code rate (there may also be three or more types of column weights) is applied. $H_B$ is a submatrix having a lower triangular structure and is an staircase matrix in which the row weight of $H_B$ is 1 in the first row and 2 elsewhere, and the column weight is 2 in every column (except for being 1 in the last column).

Figure 5:
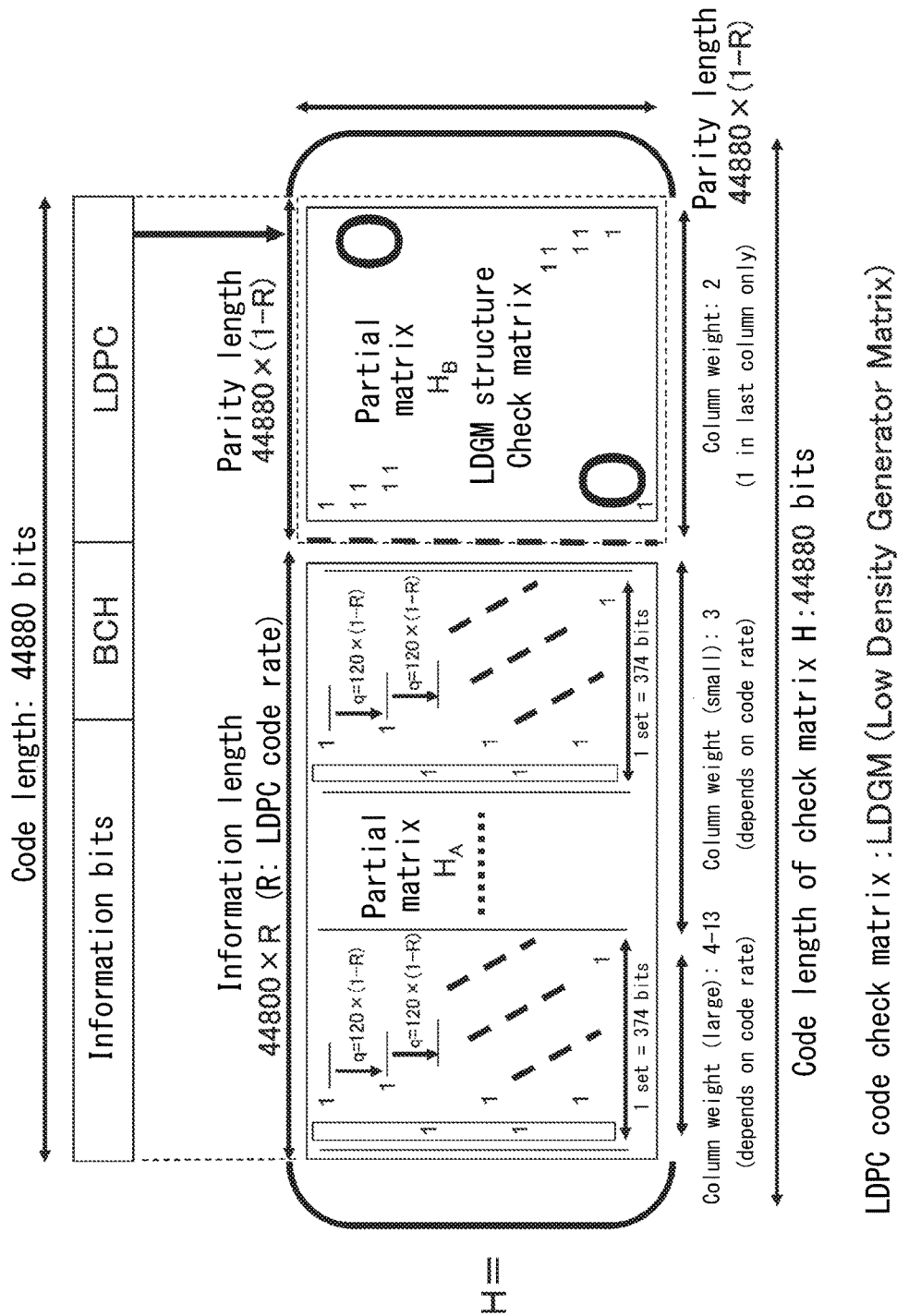
FIG. 5 illustrates the basic structure of a check matrix for LDPC encoding.

FIG. 5 illustrates the basic structure of the check matrix H. In this case, the information length 44880×R (R: LDPC code rate)=N (code length of check matrix)−P, and the parity length P=44880×(1−R).

Figure 6:
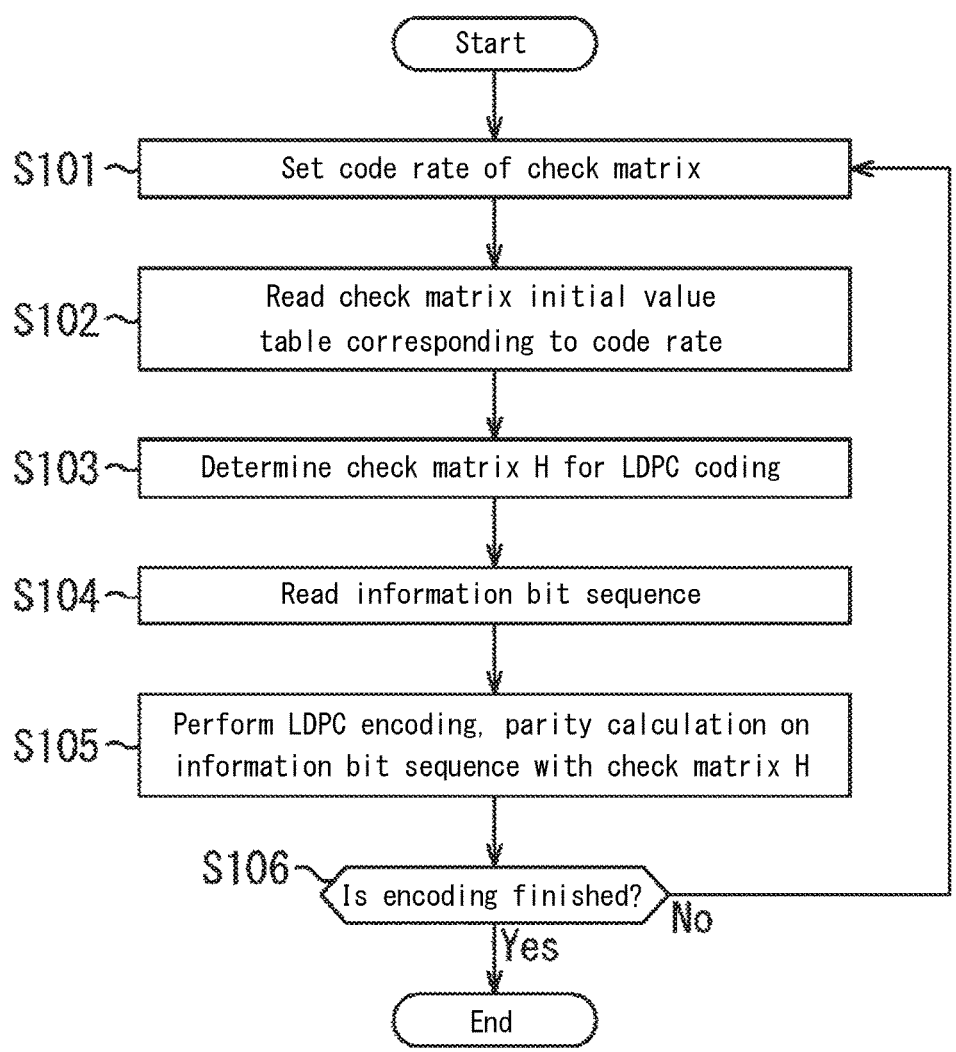
FIG. 6 is a flowchart illustrating processing by an encoder of one of the embodiments.

With reference to FIG. 6, the processing by the encoders 11-1 and 11-2 is described for steps S101 to S106.

In step S101, a predetermined code rate is chosen. For example, LDPC encoding using a check matrix with a code rate of 93/120 is set to be performed.

In step S102, a check matrix initial value table established in advance and corresponding to the code rate chosen in step S101 is prepared (for example, Table 1 for a code rate of 93/120). The encoders 11-1 and 11-2 are described as reading a check matrix initial value table stored in a predetermined memory area (not illustrated). FIG. 7 is an explanatory diagram for the check matrix initial value table. The check matrix initial value table lists row numbers of 1's (the top row number being 0) in the column direction of the check matrix corresponding to the number of column weights in each column, from the top in the order of the $(1+374\times0)^{st}$ column, $(1+374\times1)^{th}$ column, $(1+374\times2)^{th}$ column, . . . , and $(1+374\times k)^{th}$ column. The value of k varies depending on the code rate. In the case of a code rate of 93/120, k=92. The relationship in Equation (1) holds between the information length (N−P) and k.

$$N-P=(k+1)\times 374 \qquad (1)$$

In the case of a code rate of 93/120, there are three types of column weights of the check matrix: 9 from the $1^{st}$ column to the $5236^{th}$ column, 8 from the $5237^{th}$ column to the $6358^{th}$ column, and 3 from the $6359^{th}$ column to the $34782^{nd}$ column. Focusing on the column weights of the check matrix initial value table, the $1^{st}$ to $14^{th}$ rows correspond to the column weight 9, and the $14^{th}$ to $17^{th}$ rows correspond to the column weight 8. Similarly, the $18^{th}$ to $93r^d$ rows correspond to the column weight 3.

In the case of Table 1, the first row is 521, 781, 2081, 2419, 3589, 5877, 6085, 6267, and 6657, indicating that l's in the first column of the check matrix are respectively at the $521^{st}$, $781^{st}$, $2081^{st}$, $2419^{th}$, $3589^{th}$, $5877^{th}$, $6085^{th}$, $6267^{th}$, and $6657^{th}$ row position. Representing these read out row numbers in the form $h_{i-j}$ yields $h_{1-1}=521$, $h_{1-2}=781$, $h_{1-3}=2081$, $h_{1-4}=2419$, $h_{1-5}=3589$, $h_{1-6}=5877$, $h_{1-7}=6085$, $h_{1-8}=6267$, and $h_{1-9}=6657$, where i in $h_{i-j}$ is the row number of the check matrix initial value table, and j in $h_{i-j}$ is the column number of the check matrix initial value table.

Next, using the row number of the check matrix listed in the first row of the check matrix initial value table read from the predetermined memory area and using Equation (2), the check matrix row direction entry list $H_{q-j}$ for the $2^{nd}$ column to the $374^{th}$ column of the check matrix is determined (q=2 to 374). $H_{q-j}$ indicates the row number of 1's in the $q^{th}$ column of the check matrix H, and j in $H_{q-j}$ indicates the order of the entries constituting the column weight. Accordingly, in the case of column weight 9, j=1 to 9. For q=1, the first row of the check matrix initial value table is used.

$$H_{q-j}=\text{mod}\ \{(h_{i-j}+\text{mod}((q-1),374))\times Q),P\} \qquad (2)$$

Here, mod(x, y) refers to the remainder when dividing x by y. Q in Equation (2) has a different value for each code rate and is determined by Equation (3).

$$Q=P/374 \qquad (3)$$

The values obtained by calculating the $2^{nd}$ column (q=2) of the check matrix using Equation (2) are used as the row numbers of the $2^{nd}$ column of the check matrix. Similarly, calculation with Equation (2) is performed for q=3 to 374, thereby determining the row numbers of the check matrix from the $1^{st}$ to the $374^{th}$ column of the check matrix.

In step S103, the $2^{nd}$ to the $(k+1)^{th}$ (last) row of the check matrix initial value table are used to calculate all of the row numbers in the column direction of the check matrix with the above-described method. In this way, all of the row numbers of 1's in the column direction of the check matrix H are determined, thereby establishing all of the positions of 1 entries in the check matrix H.

In step S104, the check matrix H determined in step S103 is read from a predetermined memory area, and in step S105, the parity bit columns P are determined in order using Equation (4), since the check matrix H uses an LDGM structure.

$$H \cdot C^T = 0 \qquad (4)$$

$C_i$ (i=1 to 44880) is a code word, and C=[I|P]. The parity bit sequence $P_i$ for the information bit sequence $I_i$ can be calculated sequentially from Equation (4). Therefore, the code word $C_i$ can be constructed. T in Equation (4) is a transpose matrix.

In step S106, the parity bit sequence $P_i$ calculated in step S105 is added to the information bit sequence $I_i$ to form the code word $C_i$ (i=1 to 44880) for one slot.

When coding under other code rate conditions, coding can be performed with the processing in steps S101 to S106 by changing the check matrix initial value table. In this way, the check matrix is a unique matrix for each code rate, in which, taking a check matrix initial value table (for example, Table 1) established in advance as initial values, 1 entries of a partial matrix corresponding to the information length appropriate for the code rate are allocated in the column direction over a cycle of 374 columns. Accordingly, since the encoder 11-1 uses a code length of 44880 bits, encoding can be performed by changing the code rate for each slot when applying the encoder 11-1 of this embodiment to the case of the code length being 44880 bits in the slot structure indicated by the transmission system of this embodiment.

Next, the processing by the transmission device of this embodiment is described.

(Processing by Transmission Device)

The process by which the transmission device generates a transmission signal is described with reference to FIG. 8.

In step S201, a predetermined modulation scheme and code rate are chosen by the frame generator 10. For example, the chosen modulation scheme and code rate are transmitted to the reception device 2 by a TMCC signal as transmission control information that includes information on the transmission mode.

In step S202, an information bit sequence $I_i$ (i=1 to n) is prepared. The information bit sequence $I_i$ is a bit sequence formed by 0's and 1's, and the length n of the information bit sequence L differs depending on the code rate. Examples of envisioned information bit sequences include an MPEG-2 TS stream or the like. In order to improve transmission performance further, the information bit sequence L may also use a signal encoded with a different error-correcting code beforehand (not only block coding such as BCH encoding or Reed-Solomon encoding, but also a convolutional code or a different LDPC code) (step S203).

In step S204, as described above, the information bits Ii (i=1 to n) are subjected to LDPC encoding by the encoder 11-1 to generate the code word $C_i$ (i=1 to 44880) of one slot.

Figure 9:
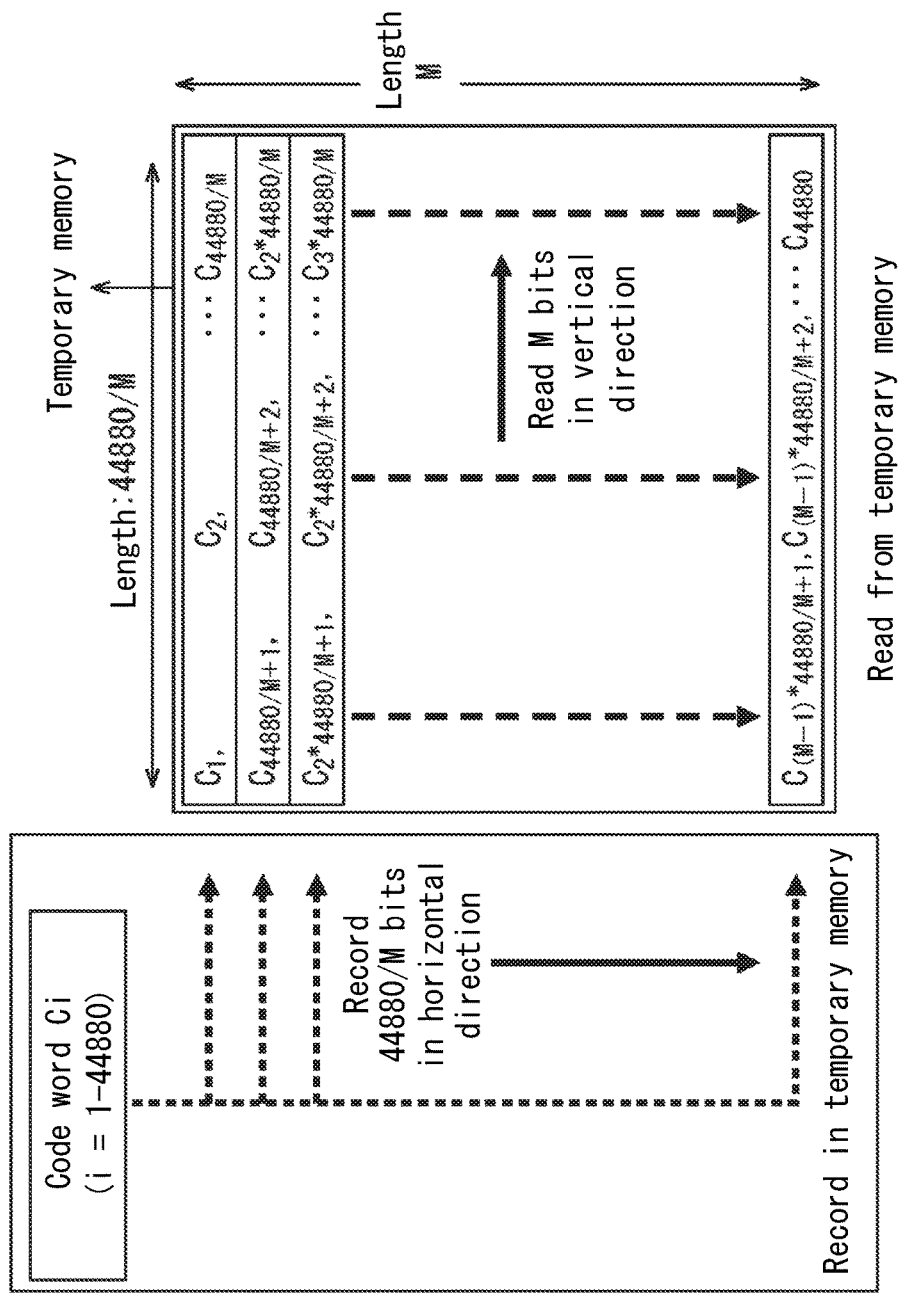
FIG. 9 is a structural diagram of bit interleaving for M-order modulation by the transmission device of one of the embodiments.

In step S205, the switch 14 prepares a temporary memory having a 2D structure in which the horizontal direction is equivalent to 44880/M and the vertical direction is equivalent to M. Then, M times in the vertical direction, the switch 14 performs the operation of recording 44880/M bits of the code word $C_i$ (i=1 to 44880) from the top in the horizontal direction of the temporary memory. M is equivalent to the modulation order. In the case of phase modulation, M=2 for QPSK, M=3 for 8PSK, M=4 for 16APSK, and M=5 for 32APSK. After the end of recording, an operation to read M bits of the code word Ci (i=1 to 44880) in the vertical direction, starting from the top of the temporary memory in the horizontal direction, is repeated 44880/M times in the horizontal direction. These operations are referred to as bit interleaving. FIG. 9 is a structural diagram of bit interleaving for M-order modulation by the bit interleaver.

In step S206, with the mapper 15, the bit interleaved code word $C_i$ (i=1 to 44880) read from the temporary memory is allocated to the phase points established by the modulation scheme M bits at a time, thereby generating a modulated symbol. Since M corresponds to the modulation order, the entire code word $C_i$ (i=1 to 44880) can be allocated to phase points by the above-mentioned operation without excess or deficiency.

In step S207, with the time division multiplexing/quadrature modulator 16, quadrature modulation is performed using the symbol modulated in step S206 to generate a transmission signal (i.e. a modulated wave signal).

By repeating the processing in the above steps S201 to S207, the modulation scheme and code rate can be changed for every 44880 bits from the transmission device 1, and a transmission signal that is encoded with an LDPC code every 44880 bits can be generated.

The encoder 11-1 uses 44880 bits as a basic unit. 44880 is a number divisible by 1, 2, 3, 4, 5, 6, 8, 10, 11, 12, 15, 16, and so forth. Accordingly, the transmission device can use an extremely large variety of values as the modulation order M and supports an extremely wide variety of multilevel modulation schemes, such as BPSK (π/2 shift BPSK), QPSK, 8PSK, 16APSK (16QAM), 32APSK (32QAM), 64QAM, 256QAM, 1024QAM, and the like. Hence, this transmission device is capable of signal transmission with extremely flexible combinations of the modulation scheme and the code rate. The check matrix initial value table for the check matrix used in the LDPC encoding in step 204 may be transmitted from the transmission device 1 to the reception device 2 as auxiliary information or may be stored in advance by the reception device 2. Alternatively, the check matrix itself may be transmitted from the transmission device 1 to the reception device 2, or the check matrix itself may be stored in advance by the reception device 2.

Next, the processing by the decoder of this embodiment is described.

(Processing by Decoder)

Figure 10:
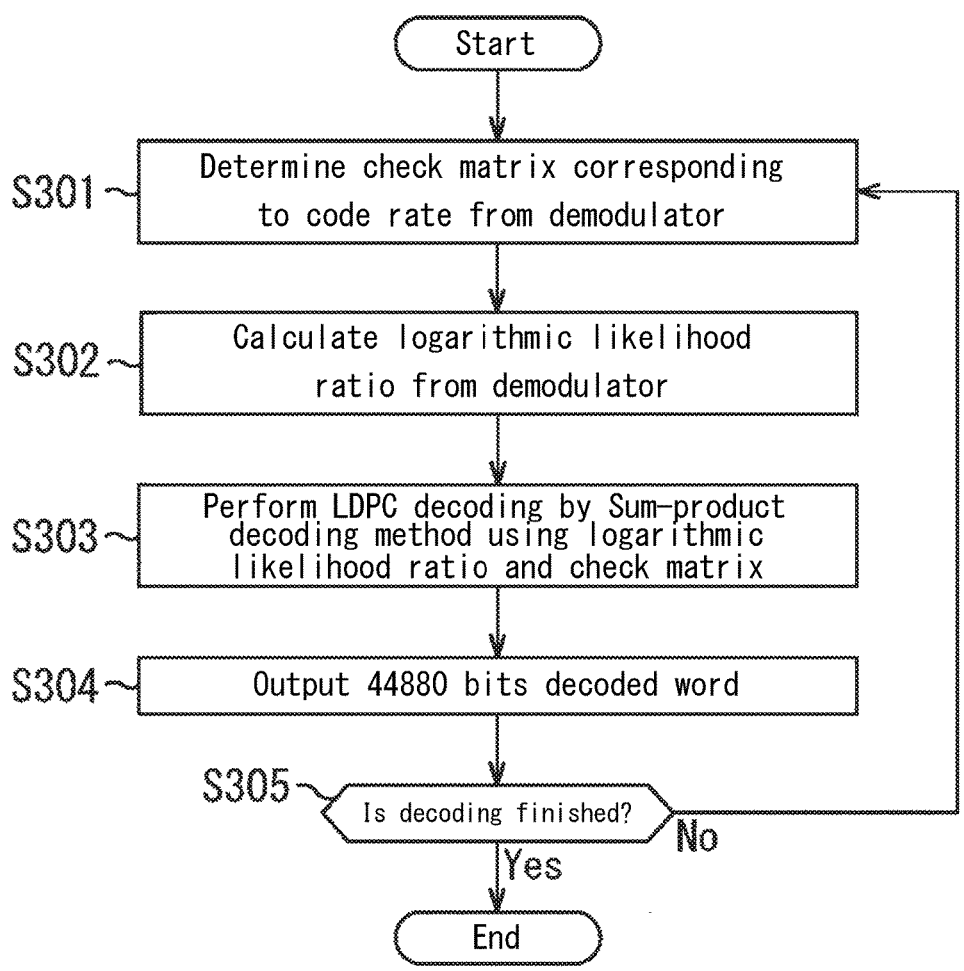
FIG. 10 is a flowchart illustrating processing by a demodulator in a reception device of one of the embodiments.

FIG. 10 illustrates the processing by the decoder in the reception device according to one of the embodiments. To simplify the following description, the modulation scheme is assumed to be two phase modulation such as BPSK.

In step S301, code rate information is read from decoded transmission control information that has passed through the demodulator (i.e. the quadrature detector 21 illustrated in FIG. 3), and the check matrix corresponding to the code rate is determined.

In the description below, the symbol number is represented as i and the bit number as n. The logarithmic likelihood ratio, which is an index representing the likelihood of bit $x_{n,i}$ that constitutes a transmission symbol $x_i$ and bit $y_{n,i}$ that constitutes a reception symbol $y_i$, is represented as $\lambda_{n,i}$.

In step S302, the logarithmic likelihood ratio $\lambda_{n,i}$ (in the case of two phase modulation, i=1 to 44880, and n=1 to 44880) is calculated based on the transmission bit $x_{n,i}$, corresponding to the transmission symbol $x_i$, and the reception symbol $y_i$. The logarithmic likelihood ratio $\lambda_{n,i}$ is the natural logarithm of the ratio of certainty for transmitted bits 0 and 1 and is represented by Equation (5), which uses the transmission bit $x_{n,i}$, corresponding to $x_i$, and the reception symbol $$\lambda_{n,i} = \ln\{P(y_i|x_{n,i}=0)/P(y_i|x_{n,i}=1)\} \quad (5)$$

In the case of using multilevel modulation other than two phase modulation, for example in the case of using 16 phase modulation such as 16APSK, the number of bits constituting the symbol $x_i$ is four. Therefore, if the bits constituting the symbol $x_i$ are $x_{0,i}$, $x_{1,i}$, $x_{1,i}$, $x_{2,i}$, and $x_{3,i}$, and the logarithmic likelihood ratios of the bits are respectively $\lambda_{0,i}$, $\lambda_{1,i}$, $\lambda_{2,i}$, and $\lambda_{3,i}$, then the logarithmic likelihood ratios are calculated as follows.

$$\lambda_{0,i} = \ln\{P(y_i|x_{0,i}=0)/P(y_i|x_{0,i}=1)\}$$

$$\lambda_{1,i} = \ln\{P(y_i|x_{1,i}=0)/P(y_i|x_{1,i}=1)\}$$

$$\lambda_{2,i} = \ln\{P(y_i|x_{2,i}=0)/P(y_i|x_{2,i}=1)\}$$

$$\lambda_{3,i} = \ln\{P(y_i|x_{3,i}=0)/P(y_i|x_{3,i}=1)\}$$

In the case of using 32 phase modulation such as 32APSK, the number of bits constituting the symbol $x_i$ is five. Therefore, if the bits constituting the symbol $x_i$ are $x_{0,i}$, $x_{1,i}$, $x_{2,i}$, $x_{3,i}$, and $x_{4,i}$, and the logarithmic likelihood ratios of the bits are respectively $\lambda_{0,i}$, $\lambda_{3,i}$, and $\lambda_{2,i}$, and $\lambda_{4,i}$, then the logarithmic likelihood ratios are calculated as follows.

$$\lambda_{0,i} = \ln\{P(y_i|x_{0,i}=0)/P(y_i|x_{0,i}=1)\}$$

$$\lambda_{1,i} = \ln\{P(y_i|x_{1,i}=0)/P(y_i|x_{1,i}=1)\}$$

$$\lambda_{2,i} = \ln\{P(y_i|x_{2,i}=0)/P(y_i|x_{2,i}=1)\}$$

$$\lambda_{3,i} = \ln\{P(y_i|x_{3,i}=0)/P(y_i|x_{3,i}=1)\}$$

$$\lambda_{4,i} = \ln\{P(y_i|x_{4,i}=0)/P(y_i|x_{4,i}=1)\}$$

In step S303, LDPC decoding is performed by a sum-product decoding method or the like using the logarithmic likelihood ratio calculated in step S302. At this time, the decoder 23 decodes using the check matrix determined in the encoders 11-1 and 11-2 of the transmission device 1. As in the case of the encoders 11-1 and 11-2, the decoder 23 may calculate the check matrix using the check matrix initial value table. The number of iterations of decoding may be set freely. Other than the sum-product decoding method, a variety of methods have been proposed for LDPC decoding, such as the min-sum decoding method. The method of this disclosure can be applied to the method that maximizes the logarithmic likelihood ratio using a check matrix.

In step S304, the decoded word $C'_i$ (i=1 to 44880) decoded in step S303 is output. At step S305, steps S301 to S304 are repeated for the sequentially demodulated signal until LDPC decoding by the decoder is complete. Once all of the decoding is complete (Yes in FIG. 10), the processing sequence for LDPC decoding ends.

Figure 11:
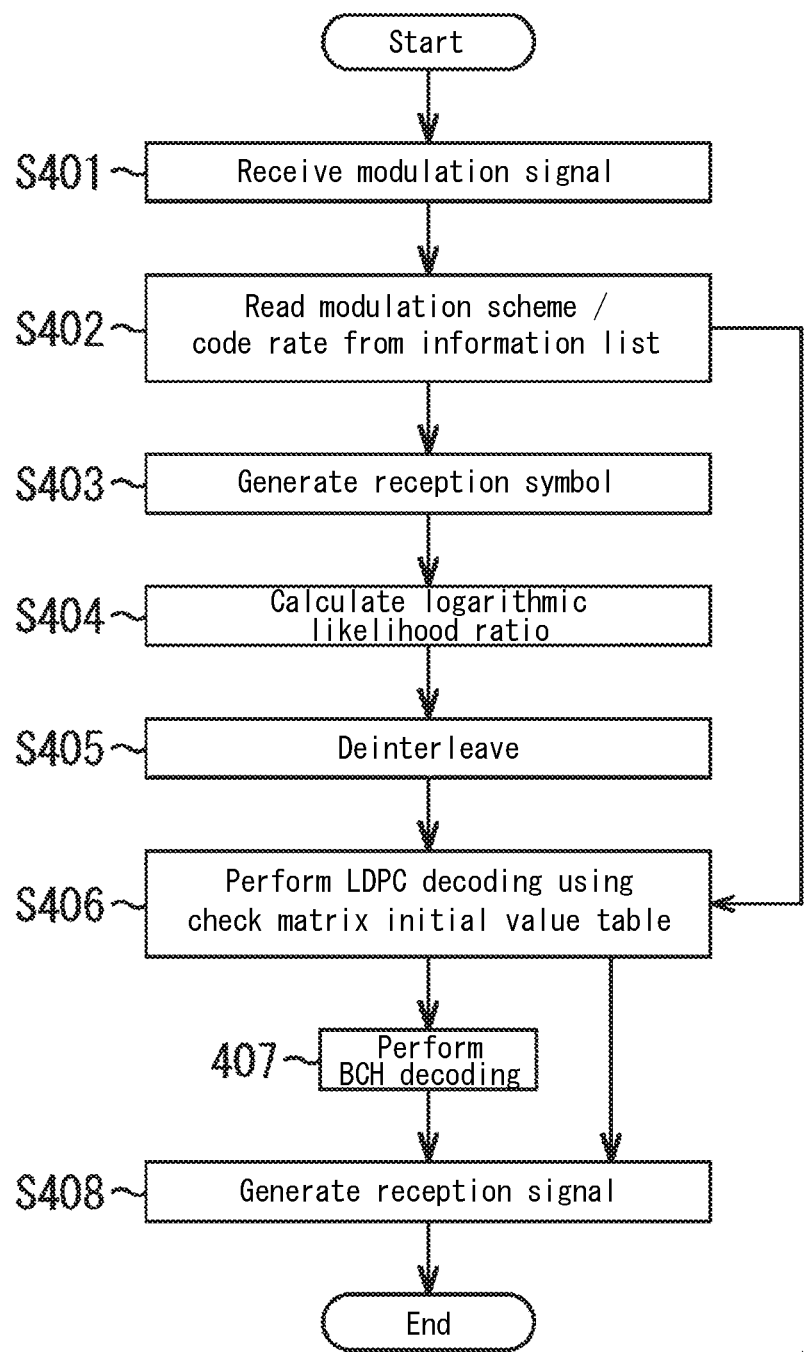
FIG. 11 is a flowchart for generation of a reception signal in a reception device of one of the embodiments.

Next, the processing by the reception device of this embodiment is described. FIG. 11 illustrates processing by the reception device 2.

(Processing by Reception Device)

In step S401, the modulation signal transmitted by the transmission device 1 is received and is demodulated by the demodulator (i.e. the quadrature detector 21 in FIG. 3).

The modulation scheme and code rate of the received modulation signal are determined in advance, and from the demodulated TMCC signal that passes through the channel selector 20 and the quadrature detector 21, transmission control information is read in step S402 by being decoded by the transmission control information decoder 22. As a result, information on the modulation scheme and the code rate can be read from the transmission mode information of the transmission control information.

In step S403, the signal received by the reception device 2 is demodulated by the channel selector 20 and the quadrature detector 21 to generate a reception signal $y_i$ (i=1 to 44880/M).

In step S404, the logarithmic likelihood ratio $\lambda_{n,i}$ (n=1 to 44880) is calculated from the reception signal $y_i$ (i=1 to 44880/M) with the decoder 23. The calculation of the logarithmic likelihood ratio $\lambda_{n,i}$ is the same as the processing by the decoder in step S302.

Figure 12:
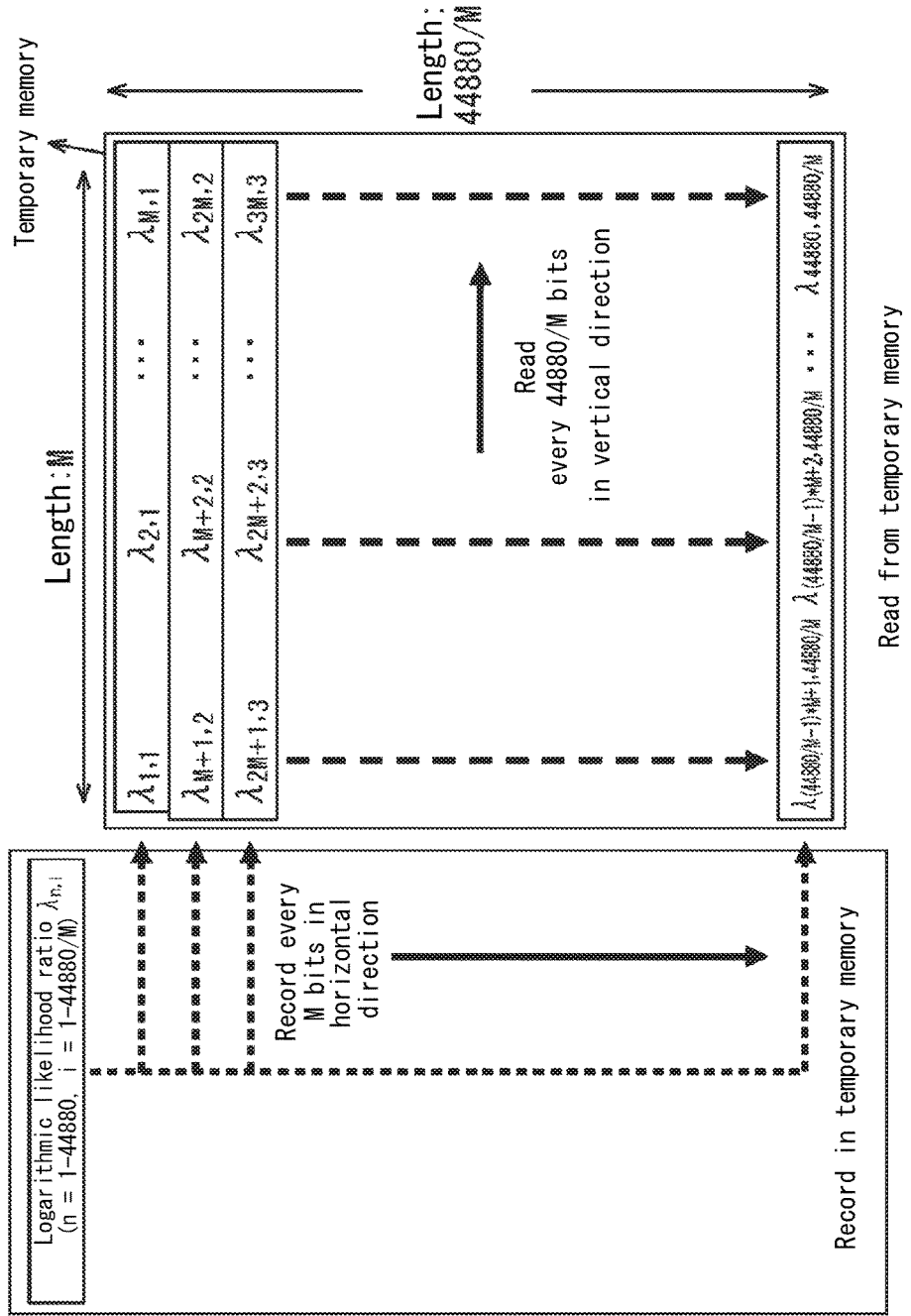
FIG. 12 is a structural diagram of deinterleaving for M-order modulation by the reception device of one of the embodiments.

In step S405, the decoder 23 or another deinterleaver (not illustrated) prepares a temporary memory having a 2D structure in which the horizontal direction is equivalent to M and the vertical direction is equivalent to 44880/M. Then, 44880/M times in the vertical direction, the decoder 23 or other deinterleaver performs the operation of recording M bits of the logarithmic likelihood ratio $\lambda_{n,i}$ from the top in the horizontal direction of the temporary memory. As one example, FIG. 12 is a structural diagram of deinterleaving for M-order modulation by the deinterleaver. After the end of recording, an operation to read 44880/M bits at a time of the logarithmic likelihood ratio $\lambda_{n,i}$ in the vertical direction, starting from the top of the temporary memory in the horizontal direction, is repeated M times in the horizontal direction. These operations are referred to as deinterleaving.

In step S406, the decoder 23 uses the deinterleaved logarithmic likelihood ratio $\lambda_{n,i}$ read in step S405 to apply LDPC decoding, outputting the decoded word $C'_i$ (i=1 to 44880) and outputting an information bit sequence $I'_i$ (i=1 to 44880-P).

In step S407, when an information bit sequence was encoded with another error-correcting code in connection with the LDPC code in the transmission device 1 (for example, a BCH code), then using the information bit sequence $I'_i$ (i=1 to 44880-P), the outer code decoder 25 performs decoding corresponding to the error-correcting code that was used and outputs the decoding result. In the case of using a BCH code, syndrome calculation is performed from the bit sequence of the LDPC decoded information bit sequence $I'_i$ (i=1 to 44880-P), and by the Berlekamp-Massey algorithm, the true information bit sequence can be decoded.

By repeating steps S401 to S407, the transmission signal generated by the transmission device 1 of this embodiment can be received in units of 44880 bits.

In this way, the reception device 2 receives a transmission signal, corresponding to a variety of combinations of a code rate and a modulation scheme, generated by the transmission device 1, has the transmission characteristics of an LDPC code based on the check matrix according to this disclosure, and can receive signals with a variety of code rates and modulation schemes.

The transmission device 1 and the reception device 2 according to this disclosure similarly have the functions of PTL 1 and PTL 2 but have a different structure than the techniques of PTL 1 and PTL 2 in that the encoder 11-1 and the decoder 23 of this disclosure include processing related to an LDPC code with an LDPC code rate of 93/120 and allow execution of processing related to an LDPC code using a check matrix initial value table that effectively improves the characteristics of the LDPC code rate of 93/120. Furthermore, the transmission device 1 and reception device 2 of this disclosure differ by respectively including, with respect to the LDPC code using the check matrix initial value table for the LDPC code rate of 93/120, a bit interleaver that operates by selectively controlling the bit read direction for each modulation scheme and a deinterleaver that operates by selectively controlling the bit write direction for each modulation scheme; and the modulator of the transmission device 1 and the demodulator of the reception device 2 according to this disclosure differ by including mapping that, in accordance with the modulation scheme (in particular, multilevel modulation), selectively allocates modulation symbols at a radius ratio appropriate for the LDPC code using the check matrix initial value table for the LDPC code rate of 93/120.

Figure 25:
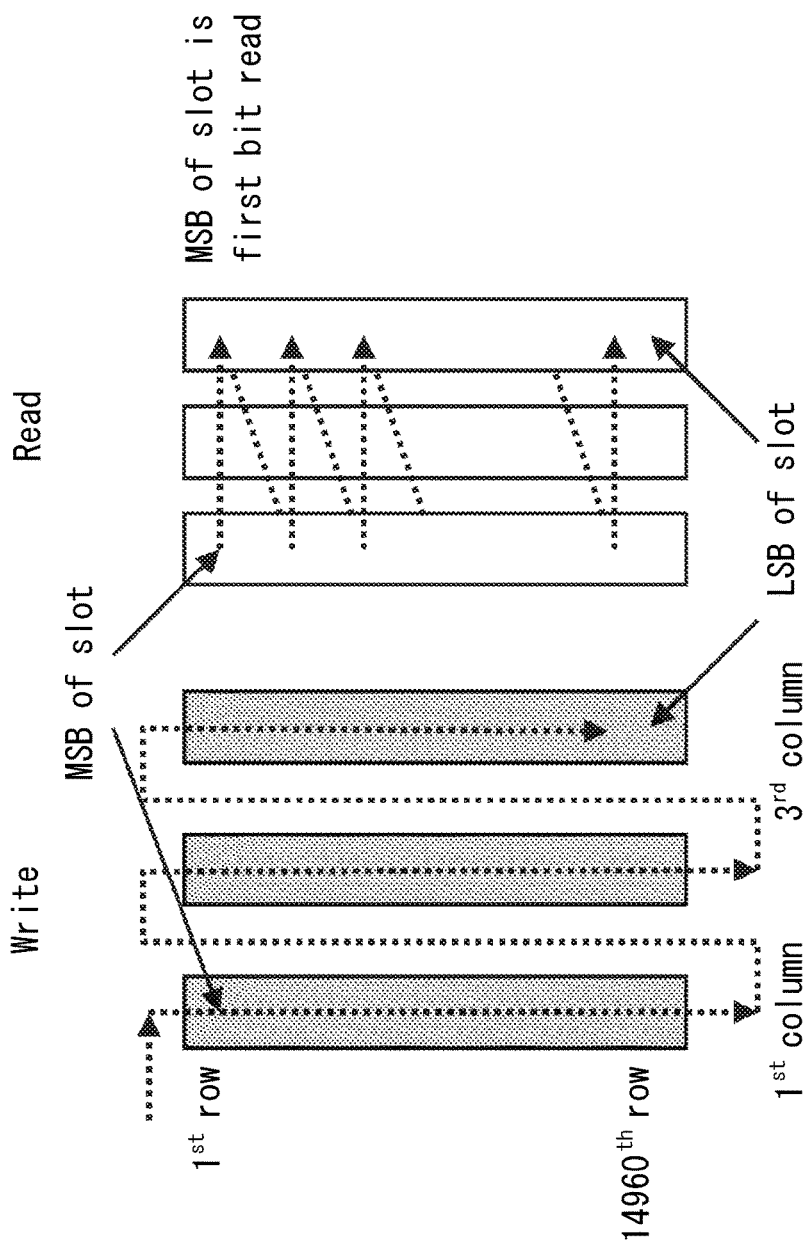
FIG. 25 illustrates the structure of an interleaver in an 8PSK modulation scheme for the LDPC code rate of 93/120 according to this disclosure.
Figure 26:
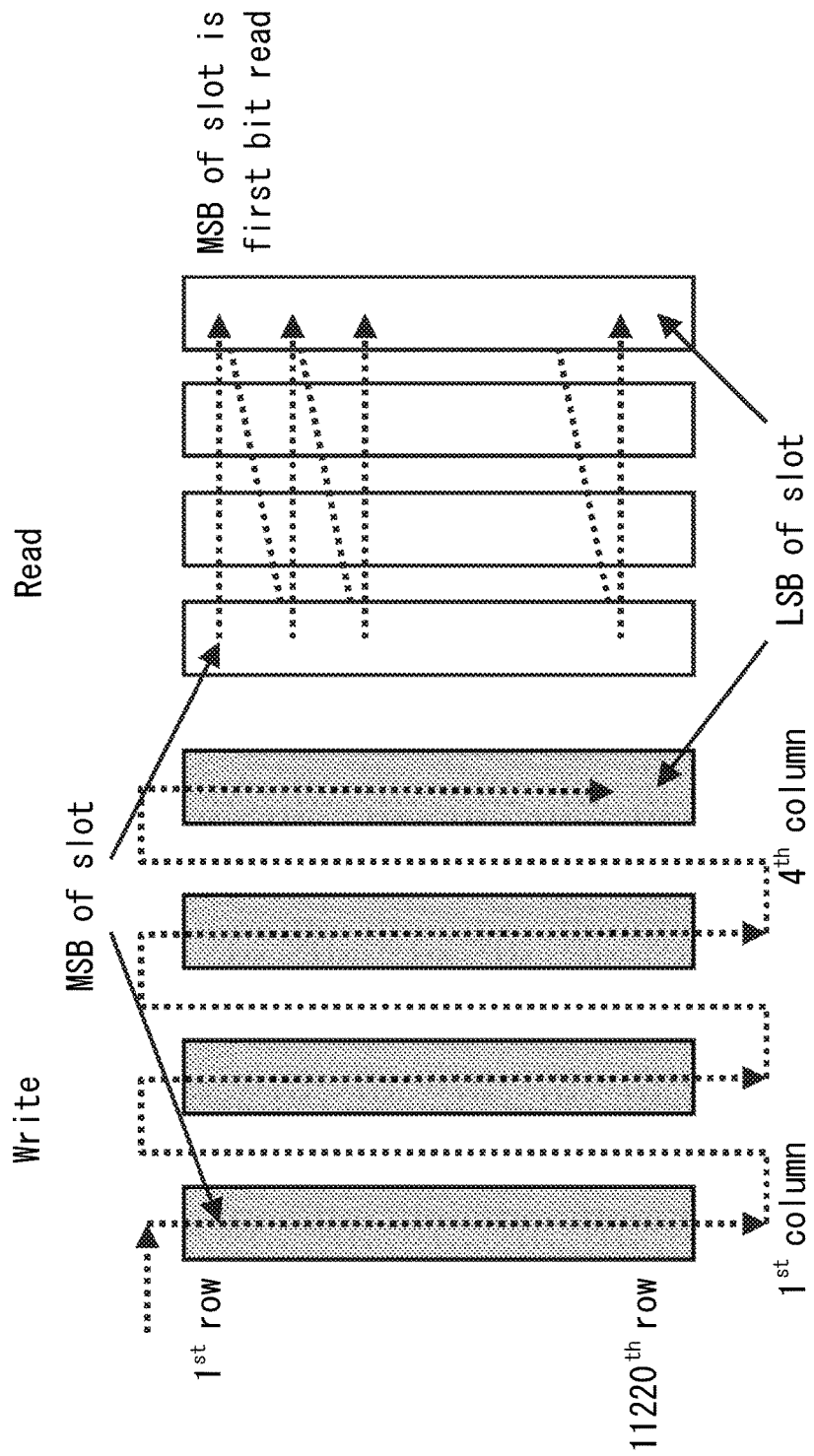
FIG. 26 illustrates the structure of an interleaver in a 16APSK modulation scheme for the LDPC code rate of 93/120 according to this disclosure.
Figure 27:
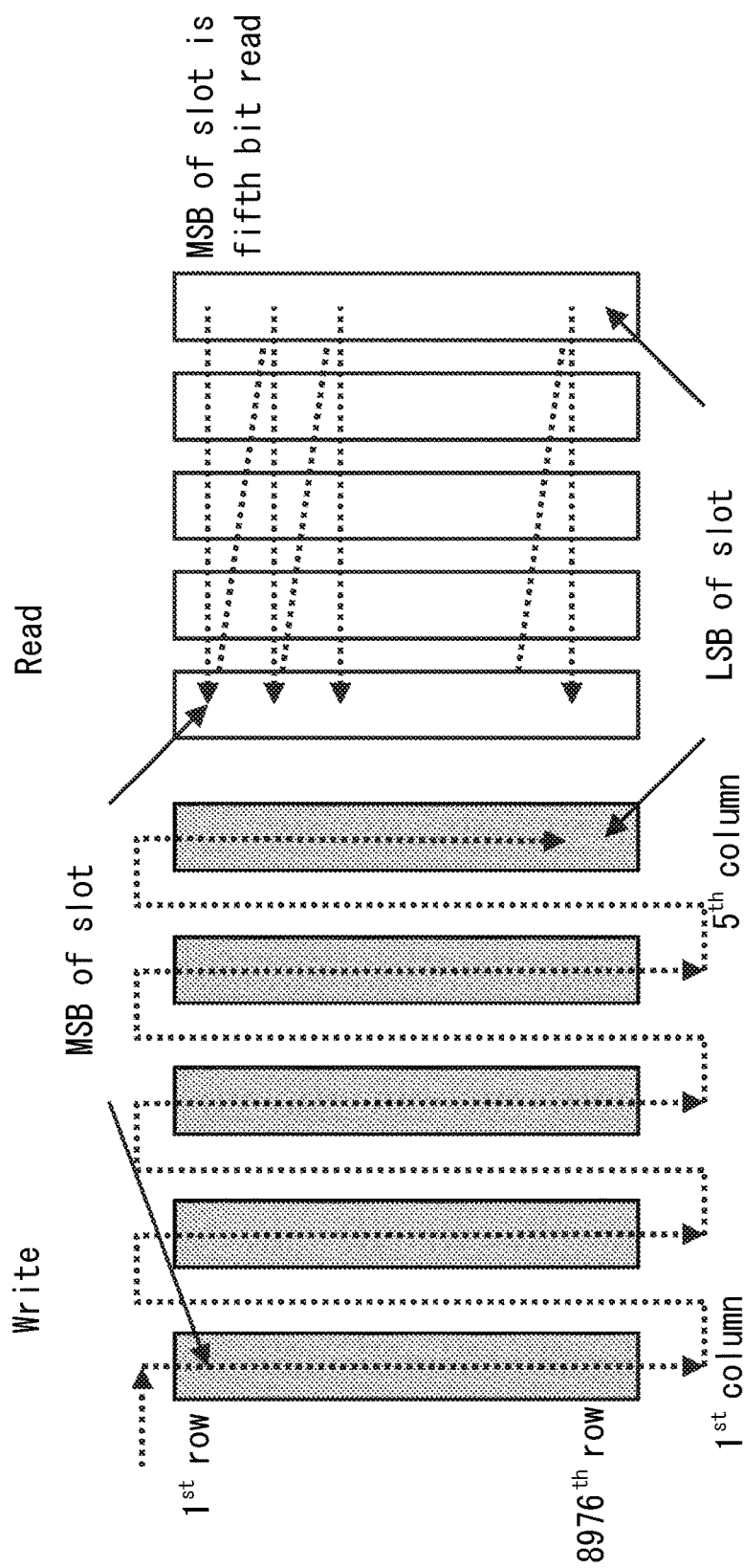
FIG. 27 illustrates the structure of an interleaver in a 32APSK modulation scheme for the LDPC code rate of 93/120 according to this disclosure.
Figure 28:
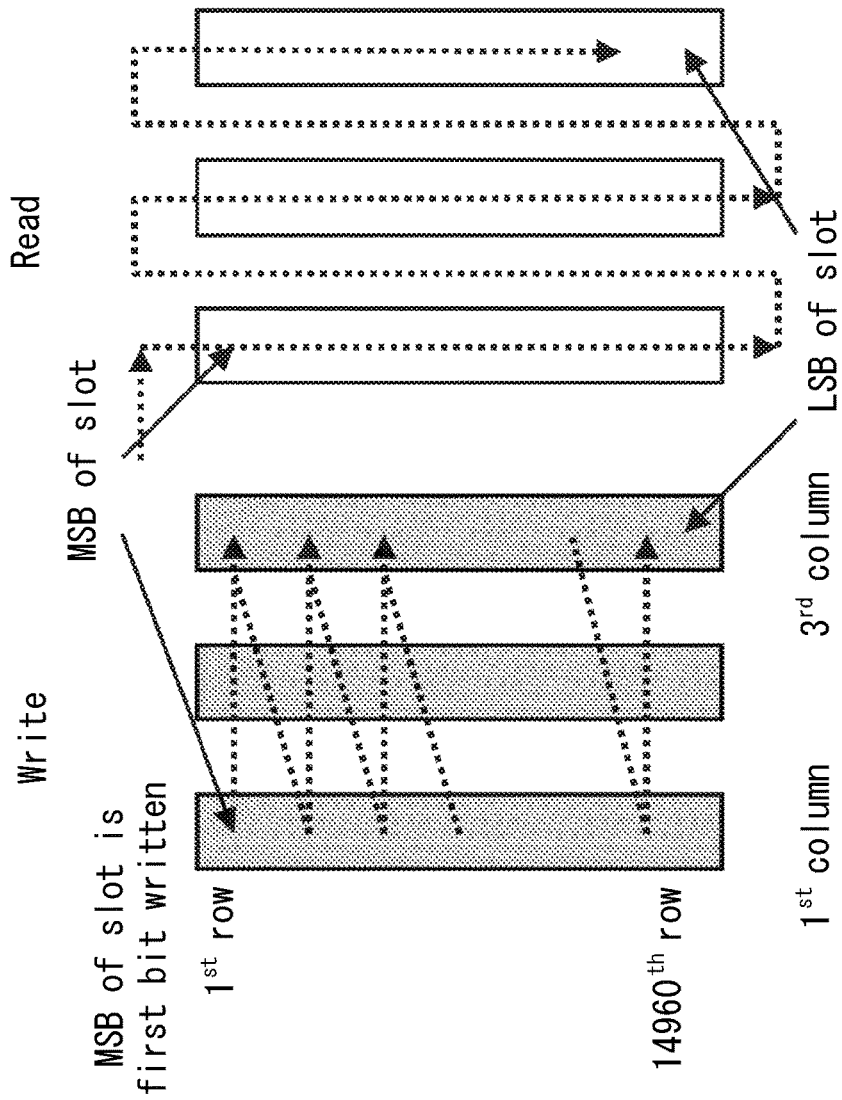
FIG. 28 illustrates the structure of a deinterleaver in an 8PSK modulation scheme for the LDPC code rate of 93/120 according to this disclosure.
Figure 29:
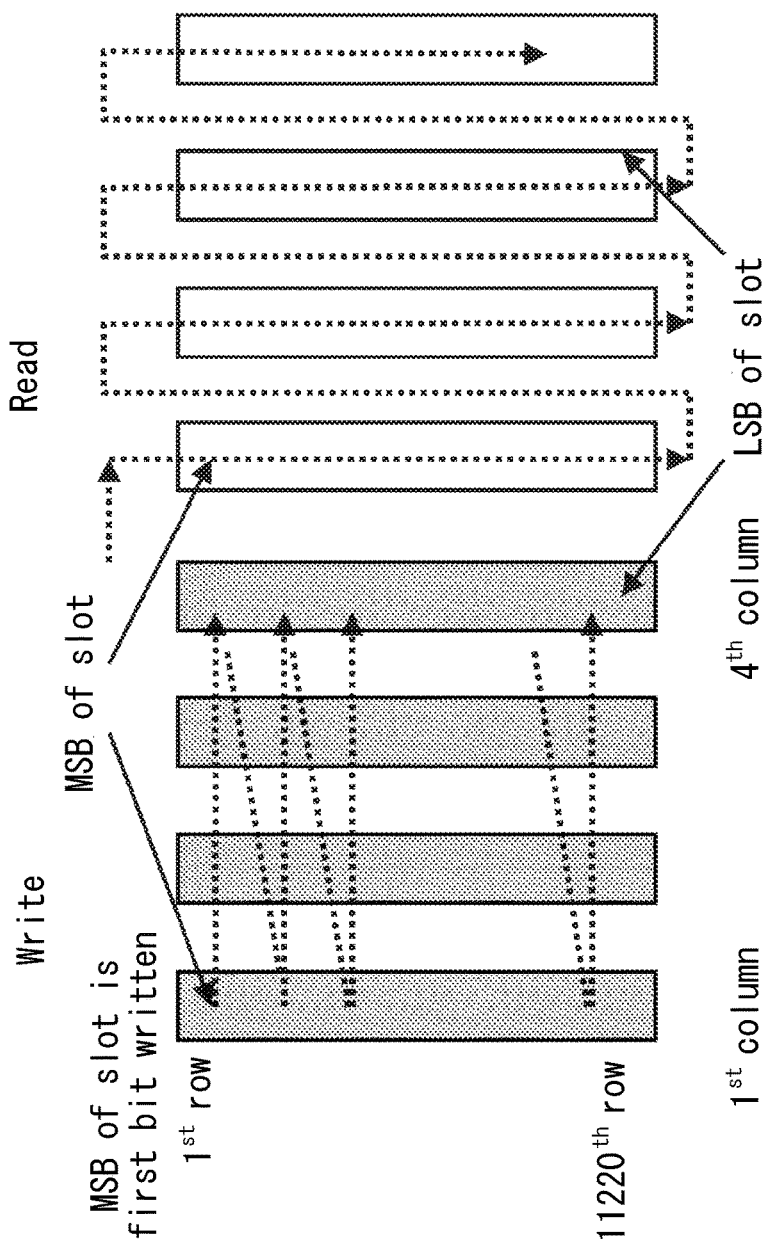
FIG. 29 illustrates the structure of a deinterleaver in a 16APSK modulation scheme for the LDPC code rate of 93/120 according to this disclosure.
Figure 30:
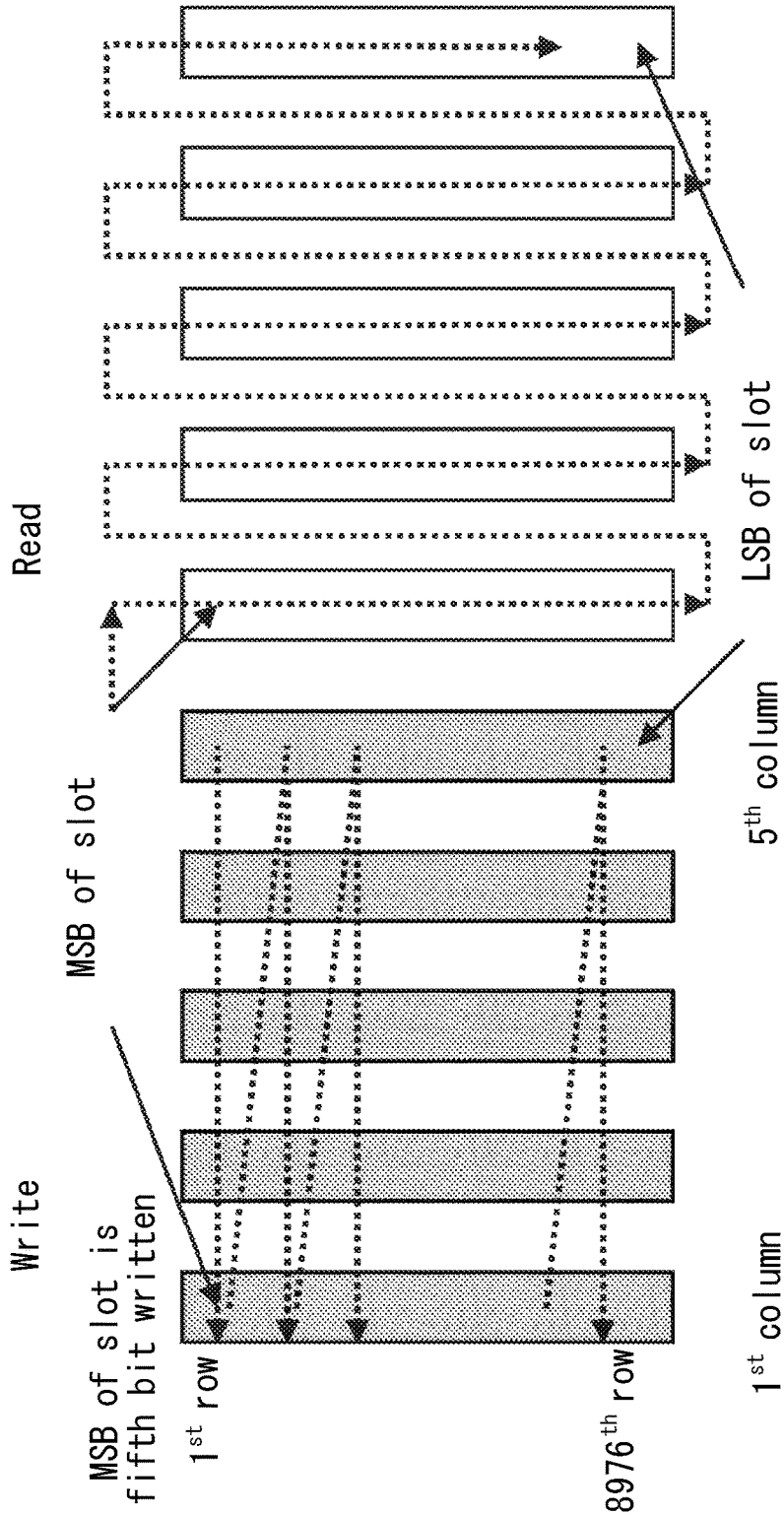
FIG. 30 illustrates the structure of a deinterleaver in a 32APSK modulation scheme for the LDPC code rate of 93/120 according to this disclosure.

FIG. 13 illustrates the specifications of the LDPC code check matrix for an LDPC code rate of 93/120. FIG. 14 illustrates the read direction of bit interleaving when applying the LDPC code check matrix for the LDPC code rate of 93/120. FIGS. 25 to 27 illustrate the structure of an 8PSK, 16APSK, and 32APSK interleaver for the LDPC code rate of 93/120, and FIGS. 28 to 30 illustrate the structure of an 8PSK, 16APSK, and 32APSK deinterleaver for the LDPC code rate of 93/120. Selective control of the forward direction and reverse direction is performed in accordance with the code rate in a known bit interleaver, but with the code rate of 93/120 according to this disclosure, selective control of the forward direction and reverse direction is performed in accordance with the modulation scheme. This is the difference between reading the bits constituting a symbol from the MSB side (forward direction) or from the LSB side (reverse direction). In the case of using 32APSK, bits are read from the LSB side during bit interleaving by the transmission device 1 and are written from the LSB side during deinterleaving by the reception device 2, thus allowing the correcting capability to be improved.

Figure 15:
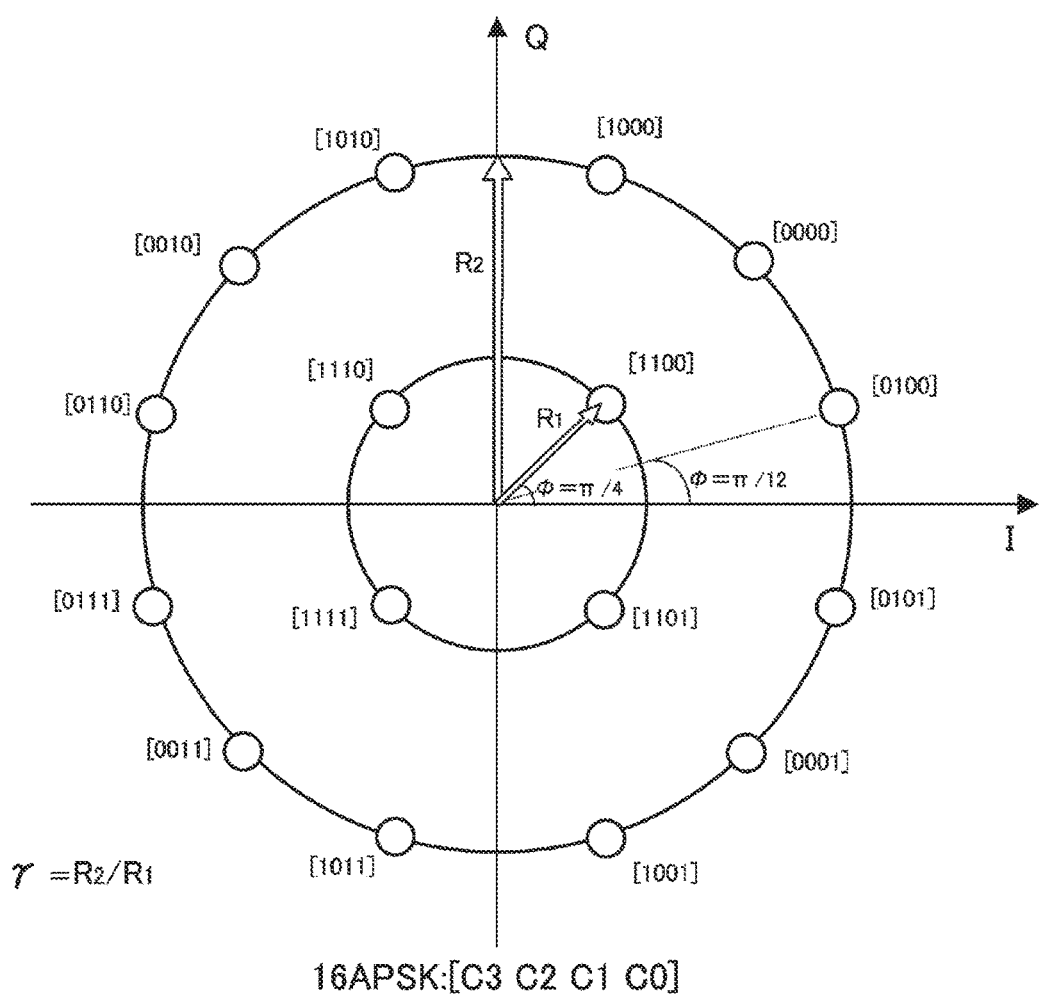
FIG. 15 illustrates a constellation diagram for 16APSK.

FIG. 15 illustrates a constellation diagram for 16APSK. In 16APSK, 12 constellation points are allocated on the outer circle of radius $R_2$ and 4 constellation points are allocated on the inner circle of radius $R_1$ ($R_2 > R_1$). The phase interval between constellation points on the outer circle is 30°, the phase interval between constellation points on the inner circle is 90°, and 4 constellation points among the constellation points on the outer circle are disposed at the phase angles of the 4 constellation points on the inner circle. The radius ratio (also referred to as "ring ratio") $\gamma$ for 16APSK is given by $R_2/R_1$.

Figure 16:
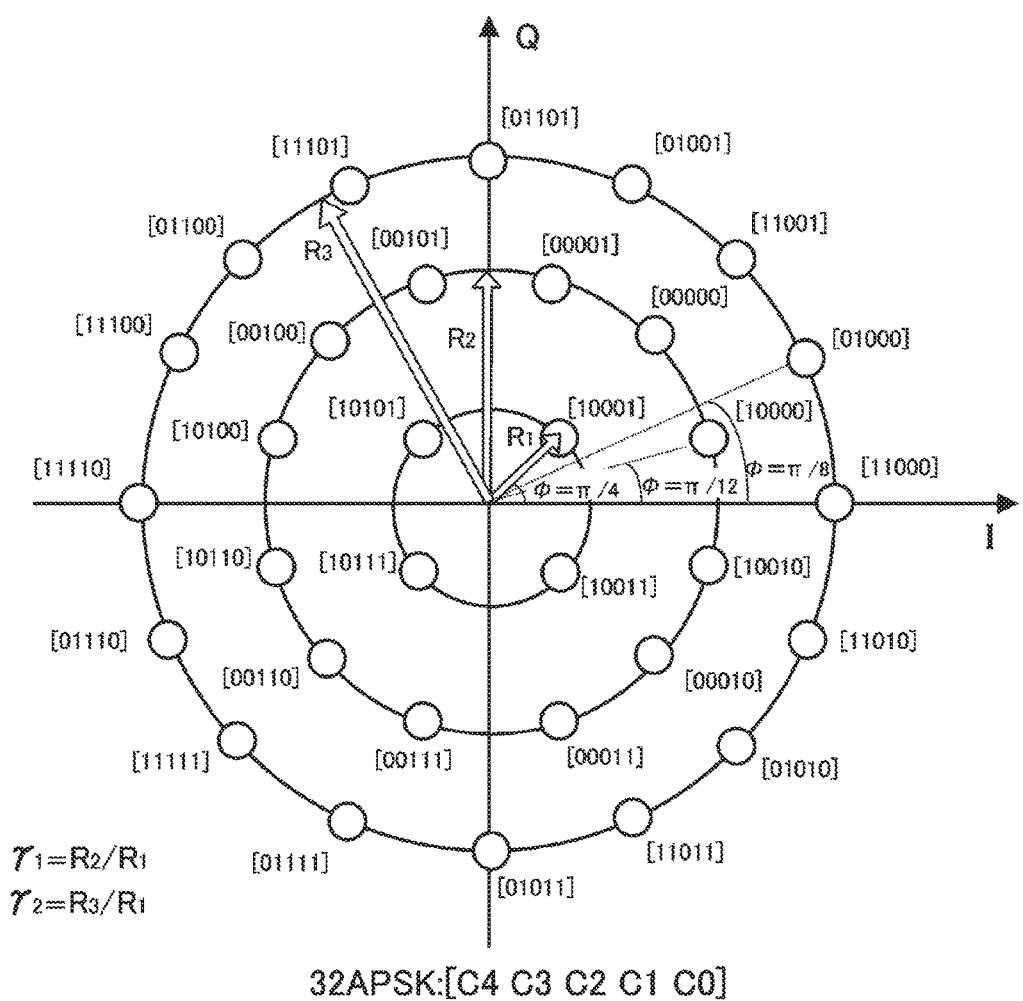
FIG. 16 illustrates a constellation diagram for 32APSK.
Figure 19:
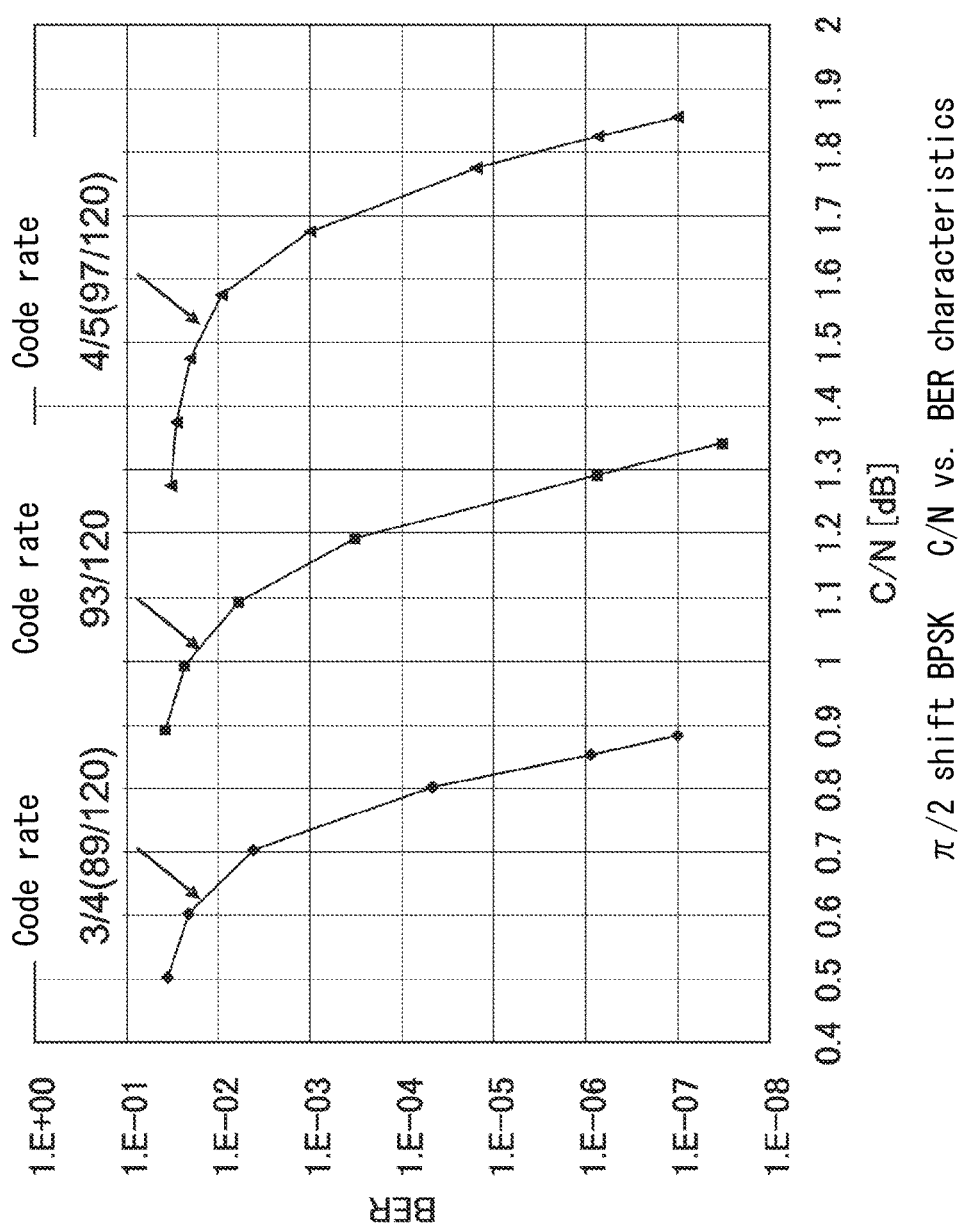
FIG. 19 illustrates C/N vs. BER characteristics at the time of π/2 shift BPSK modulation for the LDPC code rate of 93/120 in accordance with the check matrix initial value table (Table 1) according to this disclosure.
Figure 20:
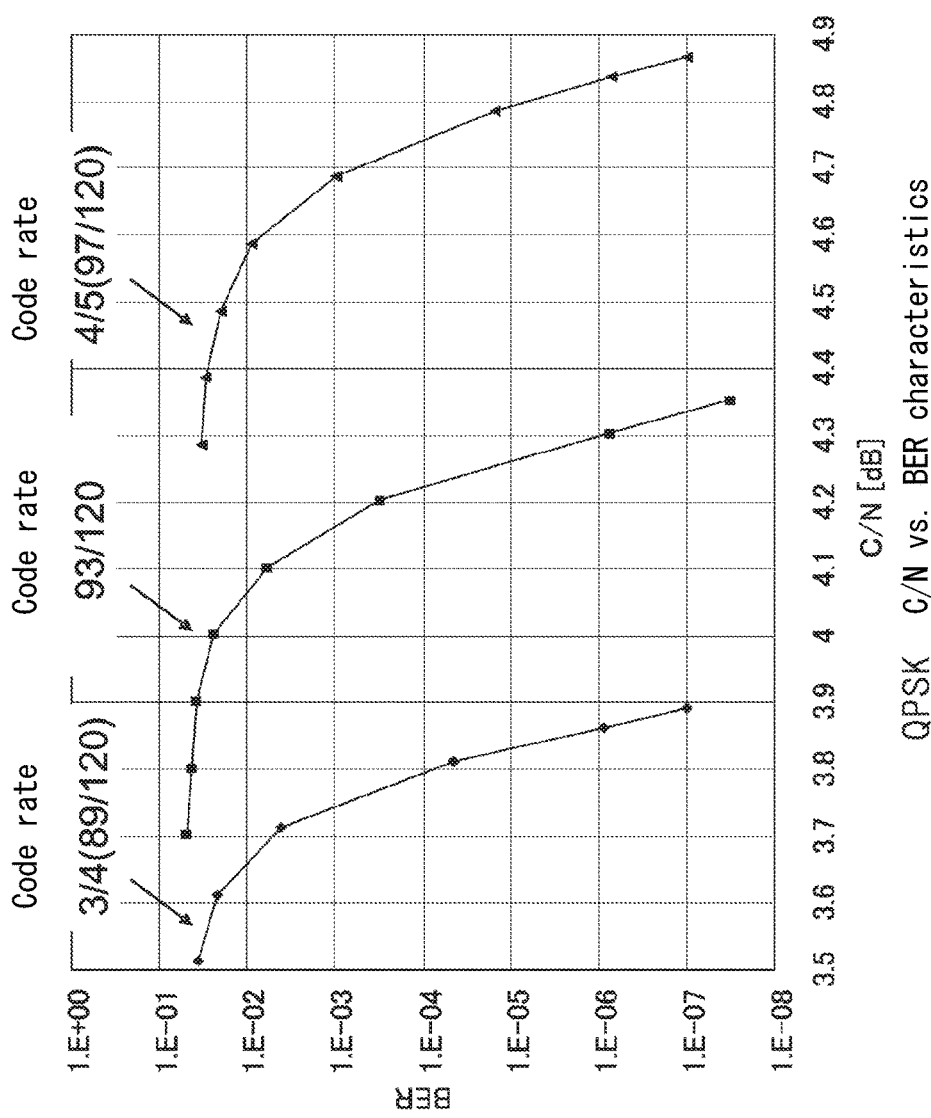
FIG. 20 illustrates C/N vs. BER characteristics at the time of QPSK modulation for the LDPC code rate of 93/120 in accordance with the check matrix initial value table (Table 1) according to this disclosure.
Figure 21:
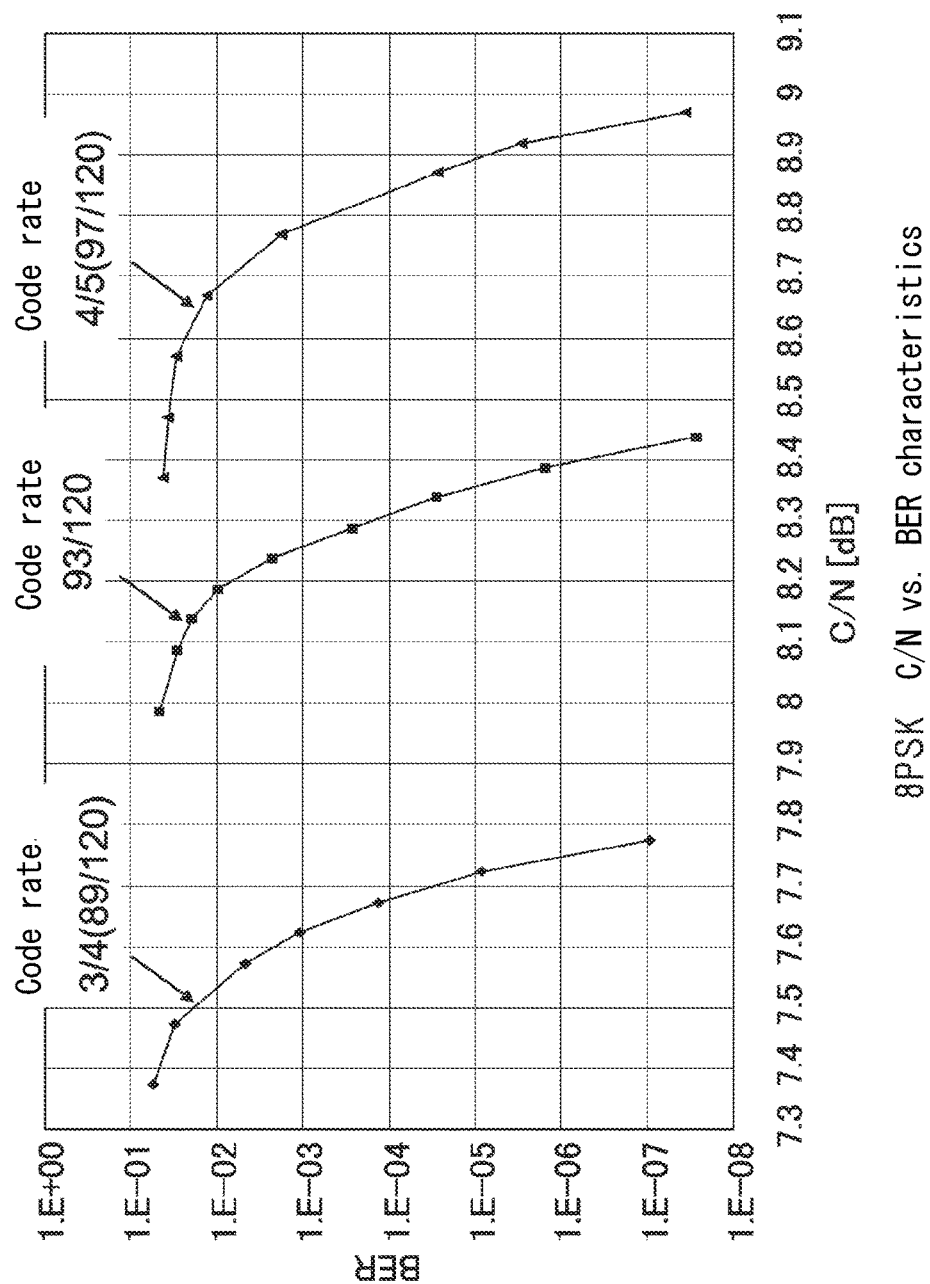
FIG. 21 illustrates C/N vs. BER characteristics at the time of 8PSK modulation for the LDPC code rate of 93/120 in accordance with the check matrix initial value table (Table 1) according to this disclosure.
Figure 22:
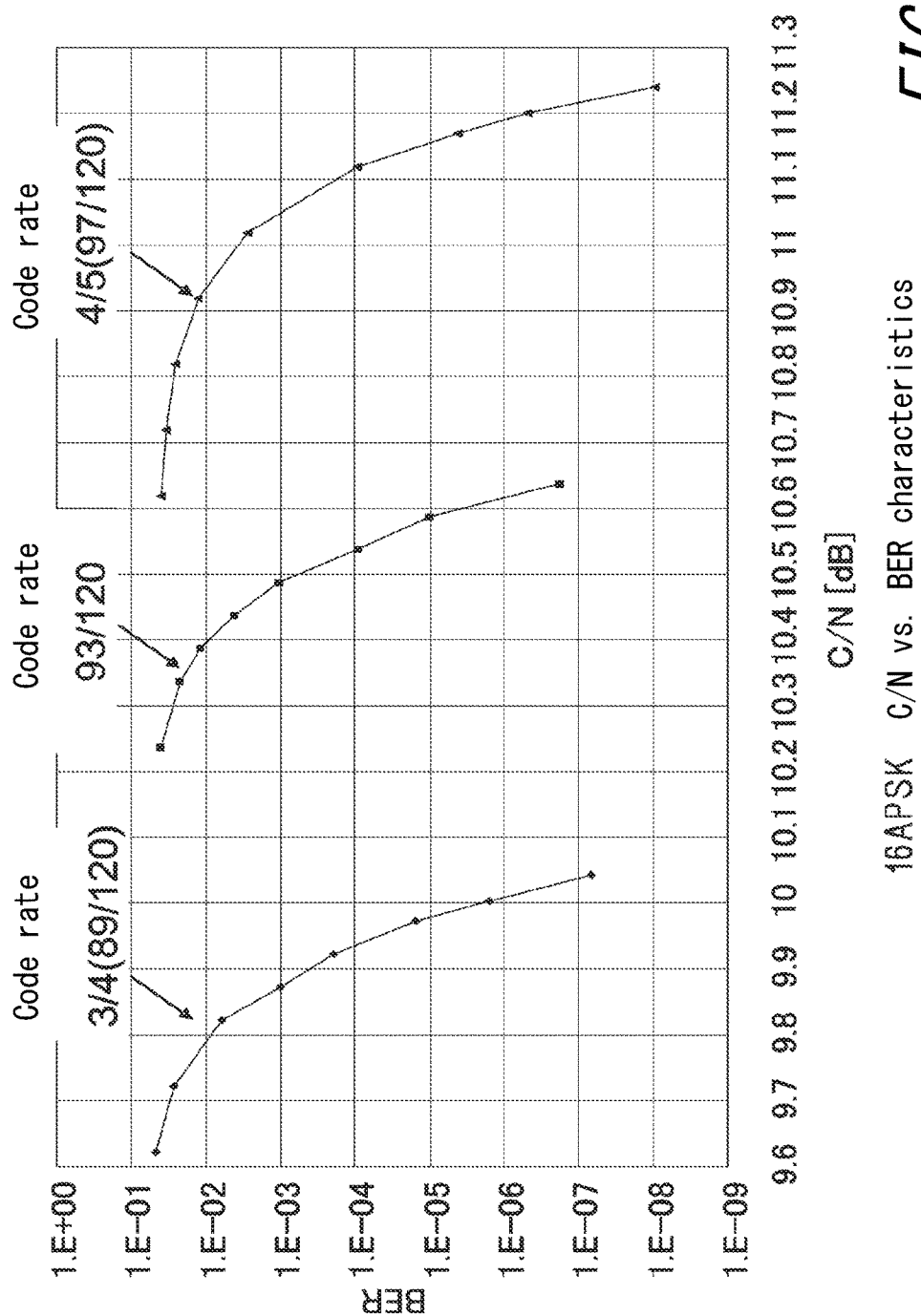
FIG. 22 illustrates C/N vs. BER characteristics at the time of 16APSK modulation for the LDPC code rate of 93/120 in accordance with the check matrix initial value table (Table 1) according to this disclosure.
Figure 23:
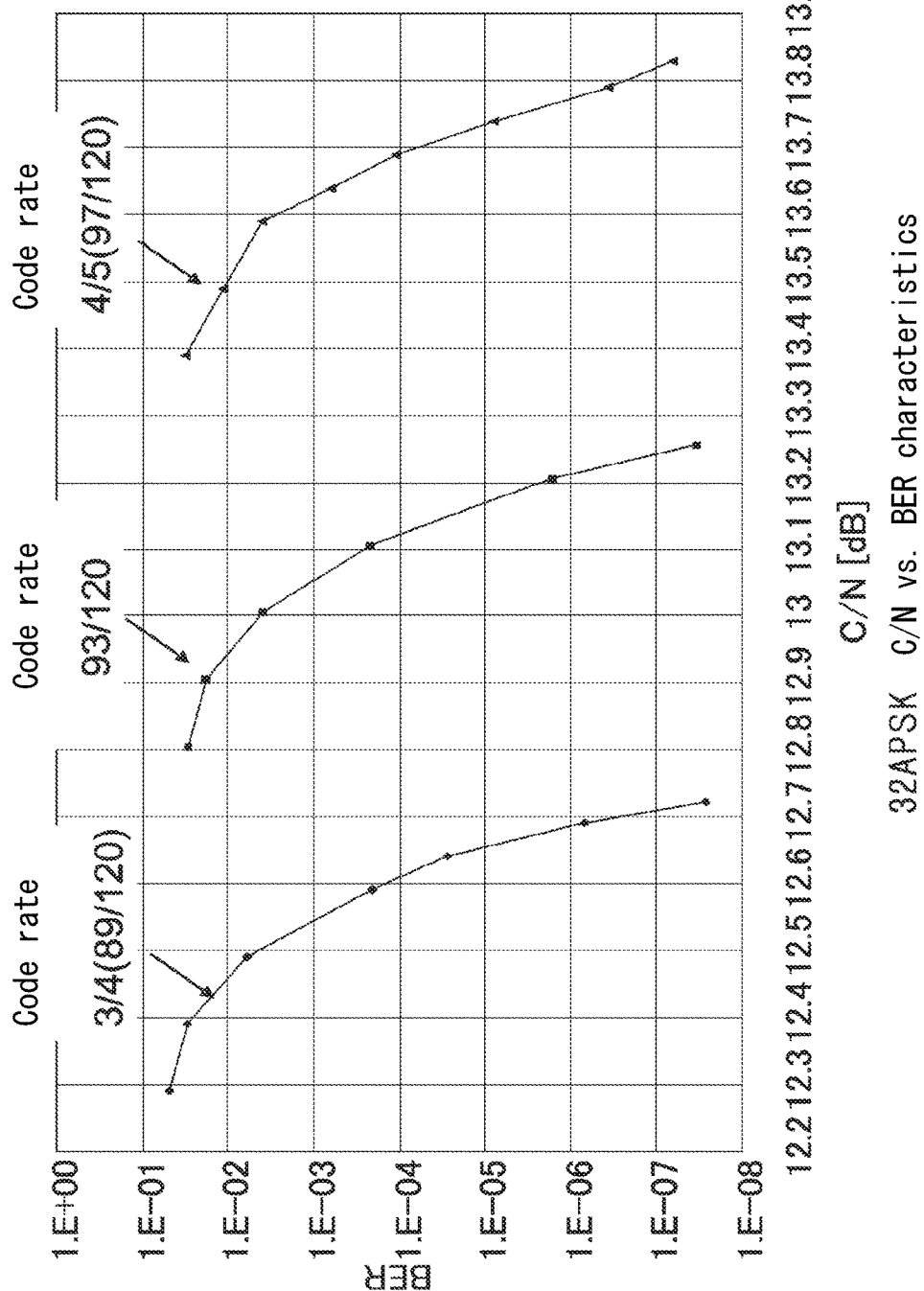
FIG. 23 illustrates C/N vs. BER characteristics at the time of 32APSK modulation for the LDPC code rate of 93/120 in accordance with the check matrix initial value table (Table 1) according to this disclosure.

FIG. 16 illustrates a constellation diagram for 32APSK. In 32APSK, 16 constellation points are allocated on the outer circle of radius $R_3$, 4 constellation points are allocated on the first inner circle of radius $R_1$ ($R_3 > R_1$), and 12 constellation points are allocated on the second inner circle of radius $R_2$ ($R_2 > R_1$). The phase interval between constellation points on the outer circle is 22.5°, the phase interval between constellation points on the first inner circle is 90°, the phase interval between constellation points on the second inner circle is 30°, and 4 constellation points among the constellation points on the second inner circle and 4 constellation points among the constellation points on the outer circle are disposed at the phase angles of the 4 constellation points on the first inner circle. The radius ratios $\gamma_1$, $\gamma_2$ for 32APSK are given by $R_2/R_1$ and $R_3/R_1$.

The radius ratio that yields a good result with respect to the LDPC code with a code rate of 93/120 may, for example, be determined for each of 16APSK and 32APSK for the LDPC code obtained from the check matrix H using the above-described check matrix initial value table (Table 1) by performing a simulation to measure BER upon transmission of an LDPC encoded modulation signal and calculating the value that minimizes BER.

In greater detail, with respect to the LDPC code with a code rate of 93/120, for 16APSK, the radius ratio $\gamma$ when applying the LDPC code check matrix for the LDPC code rate of 93/120 is 2.87 (see FIG. 17), and for 32APSK, the radius ratios $\gamma_1$ and $\gamma_2$ when applying the LDPC code check matrix for the LDPC code rate of 93/120 are 2.87 and 5.33 (see FIG. 18). As is clear from the results in the below-described FIGS. 19 to 23, good results that suppress transmission degradation were obtained when transmitting multilevel modulation symbols allocated at the radius ratios indicated in FIGS. 17 and 18 for code words of the LDPC code with the LDPC code rate of 93/120 in accordance with the above-mentioned check matrix initial value table (Table 1).

FIGS. 19 to 23 illustrate the C/N vs. BER characteristics for each modulation scheme as calculated by a computation simulation of C/N vs. BER characteristics for the LDPC code rate of 93/120 in accordance with the check matrix initial value table (Table 1). FIGS. 19 to 23 show the results after error correction by a BCH code (correcting capability of 12 bits) based on NPL 2 (ARIB STD B44). A sum-product decoding method (for example, see NPL 1) was used as the decoding algorithm. The number of decoding iterations of the sum-product decoding method was 50. As is clear from FIGS. 19 to 23, the LDPC code rate of 93/120 yields C/N vs. BER characteristics that remain between the LDPC code rate of 89/120 ($\approx 3/4$) and the LDPC code rate of 97/120 ($\approx 4/5$). Therefore, transmission performance with a greater degree of freedom than known LDPC code rates, such as the LDPC code rate of 89/120 ($\approx 3/4$) and the LDPC code rate of 97/120 ($\approx 4/5$), can be provided. FIG. 24 illustrates the required C/N of different modulation schemes for the LDPC code rate of 93/120. The required C/N is calculated based on the results from FIGS. 19 to 23, using the technique of Reference 2: A2.5 in NPL 2 (ARIB STD B44).

From the results in FIG. 24, it is clear that the high coding gain characteristic of LDPC codes can be obtained for a code length of 44880 bits by using the transmission device 1 and reception device 2 of this disclosure. Accordingly, information transmission with excellent resistance to white noise can be achieved.

In this way, the transmission device 1 can improve the performance of error correction by performing LDPC encoding in the LDPC encoder 11-1 using the check matrix H in accordance with the check matrix initial value table (Table 1) at the LDPC code rate of 93/120.

Furthermore, the transmission device 1 can prevent degradation of transmission characteristics by mapping the LDPC code, yielded by using the check matrix H in accordance with the check matrix initial value table (Table 1) at the LDPC code rate of 93/120, into the constellation points of the above-described optimal radius ratios ($\gamma$, $\gamma_1$, $\gamma_2$) with the mapper 15.

With regard to the above-described embodiment, a computer can be configured to function as the encoder, decoder, transmission device, and reception device, and a program can be suitably used to cause the computer to function as the encoder, decoder, and the various units of the transmission device and the reception device. Specifically, a controller for controlling the various units can be configured by the central processing unit (CPU) in the computer, and a storage appropriately storing a program necessary for causing the units to operate can be configured by at least one memory. In other words, by having the CPU execute the program, the computer can be caused to implement the functions of the above-described units. Furthermore, the program for implementing the functions of the units can be stored in a predetermined area of the storage (memory). Such a storage may be configured by RAM, ROM, or the like in the computer or may be configured by an external storage device (for example, a hard disk). Such a program may also be configured by a portion of software (stored in ROM or on an external storage device) running on the OS used in the computer. Furthermore, a program for causing such a computer to function as the units may be recorded on a computer-readable medium. The above-described units may also be configured as a portion of hardware or software and be implemented by combining units.

The above embodiment has been described as a representative example, but one of ordinary skill in the art will recognize that a variety of changes and substitutions may be made within the spirit and scope of this disclosure. For example, other error-correcting codes that can be combined with the LDPC code, apart from a BCH code, are not limited to block codes such as Reed-Solomon codes. Convolutional codes or other LDPC codes may be used in combination. Accordingly, this disclosure should not be interpreted as being limited by the above-described embodiments, but rather only by the scope of the appended claims.

INDUSTRIAL APPLICABILITY

The encoder, decoder, transmission device, and reception device of this disclosure are useful in a transmission system that performs time division multiplexing of various types of digital modulation schemes when the code length of the LDPC code differs for each transmission scheme.

REFERENCE SIGNS LIST

1 Transmission device
2 Reception device
10 Frame generator
11-1, 11-2 Encoder (LDPC encoding)
11-3, 11-4 Outer code encoder (BCH encoding)
12, 13 Energy disperser
14 Switch
15 Modulation mapper
16 Time division multiplexing/quadrature modulator
20 Channel selector
21 Quadrature detector
22 Transmission control information decoder
23 Decoder (LDPC decoding)
24 Reverse energy disperser
25 Outer code decoder (BCH decoding)

The invention claimed is:

1. An encoder that applies LDPC encoding to digital data using a check matrix to generate an LDPC code, wherein the check matrix is adopted an LDGM structure and has a submatrix $H_A$ determined by a check matrix initial value table and a submatrix $H_B$, the encoder comprising:
a memory storing the check matrix initial value table which indicates positions of 1 entries of the submatrix $H_A$;
and
an LDPC encoder configured to read the check matrix initial value table from the memory and LDPC encoding by using the check matrix determined based on the check matrix initial value table,
wherein a code length of the LDPC code is 44880 bits, a code rate of the LDPC code is 93/120, the submatrix $H_A$ has a dimension of 10098×34782 corresponding to an information bit sequence and has 1 entries in a column direction over a cycle of 374 columns,
the submatrix $H_B$ has a dimension of 10098×10098 corresponding to parity bits and has a triangular structure, and

| | | | | | | | |
|---|---|---|---|---|---|---|---|
| 521 | 781 | 2081 | 2419 | 3589 | 5877 | 6085 | 6267 | 6657 |
| 1769 | 2029 | 2315 | 5799 | 6215 | 7255 | 7281 | 7385 | 9361 |
| 547 | 651 | 1873 | 2159 | 2471 | 7671 | 8581 | 8659 | 8919 |
| 2107 | 3069 | 3953 | 4851 | 5851 | 8555 | 9113 | 8815 | 9049 |
| 131 | 4935 | 5038 | 5565 | 6406 | 7515 | 7593 | 8074 | 7905 |
| 495 | 1821 | 2705 | 3095 | 3485 | 7459 | 8452 | 8503 | 8841 |
| 638 | 880 | 2073 | 2426 | 5014 | 6475 | 7307 | 8968 | 9179 |
| 27 | 910 | 2731 | 3199 | 4915 | 7923 | 8061 | 9543 | 9595 |
| 869 | 3081 | 3396 | 4109 | 6137 | 6345 | 7320 | 7880 | 8619 |
| 2226 | 1979 | 2178 | 4701 | 5331 | 6423 | 9738 | 9224 | 9491 |
| 2353 | 2937 | 4337 | 3458 | 4496 | 4375 | 4889 | 9532 | 9725 |
| 9138 | 1381 | 1809 | 1449 | 1535 | 4655 | 8303 | 8113 | 8269 |
| 4855 | 7552 | 6470 | 8936 | 7994 | 7002 | 9233 | 9174 | 9647 |
| 1991 | 6823 | 3584 | 6083 | 6115 | 5899 | 7302 | 7463 | 8529 |
| 2777 | 2603 | 2707 | 3615 | 3823 | 5123 | 6995 | 9153 | |
| 573 | 1941 | 7936 | 7524 | 7112 | 7047 | 9023 | 9673 | |
| 1892 | 1847 | 2689 | 7176 | 7661 | 8559 | 7801 | 9465 | |
| 7764 | 7894 | 7957 | | | | | | |
| 3756 | 5481 | 8893 | | | | | | |
| 3403 | 7657 | 8373 | | | | | | |
| 3572 | 4670 | 4343 | | | | | | |
| 8924 | 7853 | 8217 | | | | | | |
| 4000 | 6095 | 9101 | | | | | | |
| 1743 | 6759 | 7541 | | | | | | |
| 1249 | 7827 | 9439 | | | | | | |
| 3312 | 5833 | 7177 | | | | | | |
| 3017 | 5985 | 5773 | | | | | | |
| 497 | 5080 | 9231 | | | | | | |
| 1301 | 5407 | 4837 | | | | | | |
| 878 | 2598 | 2887 | | | | | | |
| 7100 | 5900 | 6605 | | | | | | |
| 2644 | 5537 | 8243 | | | | | | |
| 4601 | 5311 | 5253 | | | | | | |
| 6722 | 8930 | 9777 | | | | | | |
| 3332 | 4132 | 5227 | | | | | | |
| 8551 | 8991 | 9335 | | | | | | |
| 2419 | 2602 | 4421 | | | | | | |
| 5390 | 4626 | 8035 | | | | | | |
| 4110 | 5955 | 7879 | | | | | | |
| 2589 | 5643 | 6709 | | | | | | |
| 917 | 6697 | 8139 | | | | | | |
| 838 | 7638 | 9517 | | | | | | |
| 1230 | 2913 | 7619 | | | | | | |
| 2497 | 3519 | 5903 | | | | | | |
| 3307 | 4131 | 4577 | | | | | | |
| 5096 | 5435 | 7021 | | | | | | |
| 4121 | 7554 | 9621 | | | | | | | is a first half of the check matrix initial value table for the code rate of 93/120, and

| | | |
|---|---|---|
| 6742 | 5965 | 8945 |
| 6140 | 6781 | 8321 |
| 2452 | 6557 | 7697 |
| 5034 | 4842 | 9205 |
| 4057 | 5398 | 9309 |
| 2445 | 3982 | 8191 |
| 3641 | 8639 | 7775 |
| 4946 | 7418 | 8737 |
| 1862 | 1613 | 3147 |
| 7115 | 2965 | 5201 |
| 1405 | 6891 | 8763 |
| 915 | 1431 | 8971 |
| 5167 | 4965 | 5721 |
| 1926 | 1888 | 5461 |
| 2686 | 2165 | 7099 |
| 2802 | 2055 | 5539 |
| 1329 | 4737 | 9413 |

-continued

| | | |
|---|---|---|
| 1660 | 469 | 1951 |
| 5194 | 9957 | 93g7 |
| 3015 | 5560 | 7983 |
| 4083 | 4239 | 4785 |
| 3348 | 6541 | 8165 |
| 6843 | 6820 | 9803 |
| 7736 | 5291 | 6371 |
| 1880 | 5079 | 9699 |
| 79 | 2033 | 6189 |
| 5874 | 5487 | 7762 |
| 6655 | 9299 | 9075 |
| 6139 | 5381 | 7567 |
| 1406 | 5583 | 6839 |
| 4609 | 3306 | 5513 |
| 319 | 3991 | 6917 |
| 5989 | 8846 | 9569 |
| 4735 | 4497 | 4447 |
| 2814 | 6943 | 8633 |
| 5453 | 5702 | 6059 |
| 3708 | 5981 | 9751 |
| 6368 | 5169 | 7333 |
| 3369 | 8002 | 9283 |
| 2628 | 2838 | 5383 |
| 7740 | 5424 | 7645 |
| 2130 | 1372 | 3121 |
| 1608 | 5747 | 8997 |
| 7097 | 7238 | 8399 |
| 2816 | 5125 | 5409 |
| 649 | 1657 | 2835 | is a second half of the check matrix initial value table for the code rate of 93/120.

2. A transmission device comprising:
the encoder of claim 1; and
a bit interleaver configured to read data encoded by the encoder of claim 1 by reading in a forward direction when a modulation scheme is 8PSK and 16APSK and by reading in a reverse direction when the modulation scheme is 32APSK.

3. A decoder that applies LDPC decoding to LDPC code using a check matrix, wherein the check matrix is adopted an LDGM structure and has a submatrix $H_A$ determined by a check matrix initial value table and a submatrix $H_B$, the decoder comprising:
a memory storing a check matrix initial value table which indicates positions of 1 entries of the submatrix $H_A$; and
an LDPC decoder configured to read the check matrix initial value table from the memory and LDPC decoding by using the check matrix determined based on the check matrix initial value table,
wherein a code length of the LDPC code is 44880 bits,
a code rate of the LDPC code is 93/120,
the submatrix $H_A$ has a dimension of 10098×34782 corresponding to an information bit sequence and has 1 entries in a column direction over a cycle of 374 columns,
the submatrix $H_B$ has a dimension of 10098×10098 corresponding to parity bits and has a triangular structure, and

| | | | | | | | | |
|---|---|---|---|---|---|---|---|---|
| 521 | 781 | 2081 | 2419 | 3589 | 5877 | 6085 | 6267 | 6657 |
| 1769 | 2029 | 2315 | 5799 | 6215 | 7255 | 7281 | 7385 | 9361 |
| 547 | 651 | 1873 | 2159 | 2471 | 7671 | 8581 | 8659 | 8919 |
| 2107 | 3069 | 3953 | 4851 | 5851 | 8555 | 9113 | 8815 | 9049 |
| 131 | 4935 | 5038 | 5565 | 6406 | 7515 | 7593 | 8074 | 7905 |
| 495 | 1821 | 2705 | 3095 | 3485 | 7459 | 8452 | 8503 | 8841 |
| 638 | 880 | 2073 | 2426 | 5014 | 6475 | 7307 | 8968 | 9179 |
| 27 | 910 | 2731 | 3199 | 4915 | 7923 | 8061 | 9543 | 9595 |
| 869 | 3081 | 3396 | 4109 | 6137 | 6345 | 7320 | 7880 | 8619 |

-continued

| | | | | | | | | |
|---|---|---|---|---|---|---|---|---|
| 2226 | 1979 | 2178 | 4701 | 5331 | 6423 | 9738 | 9224 | 9491 |
| 2353 | 2937 | 4337 | 3458 | 4496 | 4375 | 4889 | 9532 | 9725 |
| 9138 | 1381 | 1809 | 1449 | 1535 | 4655 | 8303 | 8113 | 8269 |
| 4855 | 7552 | 6470 | 8936 | 7994 | 7002 | 9233 | 9174 | 9647 |
| 1991 | 6823 | 3584 | 6083 | 6115 | 5899 | 7302 | 7463 | 8529 |
| 2777 | 2603 | 2707 | 3615 | 3823 | 5123 | 6995 | 9153 | |
| 573 | 1941 | 7936 | 7524 | 7112 | 7047 | 9023 | 9673 | |
| 1892 | 1847 | 2689 | 7176 | 7661 | 8559 | 7801 | 9465 | |
| 7764 | 7894 | 7957 | | | | | | |
| 3756 | 5481 | 8893 | | | | | | |
| 3403 | 7657 | 8373 | | | | | | |
| 3572 | 4670 | 4343 | | | | | | |
| 8924 | 7853 | 8217 | | | | | | |
| 4000 | 6095 | 9101 | | | | | | |
| 1743 | 6759 | 7541 | | | | | | |
| 1249 | 7827 | 9439 | | | | | | |
| 3312 | 5833 | 7177 | | | | | | |
| 3017 | 5985 | 5773 | | | | | | |
| 497 | 5080 | 9231 | | | | | | |
| 1301 | 5407 | 4837 | | | | | | |
| 878 | 2598 | 2887 | | | | | | |
| 7100 | 5900 | 6605 | | | | | | |
| 2644 | 5537 | 8243 | | | | | | |
| 4601 | 5311 | 5253 | | | | | | |
| 6722 | 8930 | 9777 | | | | | | |
| 3332 | 4132 | 5227 | | | | | | |
| 8551 | 8991 | 9335 | | | | | | |
| 2419 | 2602 | 4421 | | | | | | |
| 5390 | 4626 | 8035 | | | | | | |
| 4110 | 5955 | 7879 | | | | | | |
| 2589 | 5643 | 6709 | | | | | | |
| 917 | 6697 | 8139 | | | | | | |
| 838 | 7638 | 9517 | | | | | | |
| 1230 | 2913 | 7619 | | | | | | |
| 2497 | 3519 | 5903 | | | | | | |
| 3307 | 4131 | 4577 | | | | | | |
| 5096 | 5435 | 7021 | | | | | | |
| 4121 | 7554 | 9621 | | | | | | | is a first half of the check matrix initial value table for the code rate of 93/120, and

| | | |
|---|---|---|
| 6742 | 5965 | 8945 |
| 6140 | 6781 | 8321 |
| 2452 | 6557 | 7697 |
| 5034 | 4842 | 9205 |
| 4057 | 5398 | 9309 |
| 2445 | 3982 | 8191 |
| 3641 | 8639 | 7775 |
| 4946 | 7418 | 8737 |
| 1862 | 1613 | 3147 |
| 7115 | 2965 | 5201 |
| 1405 | 6891 | 8763 |
| 915 | 1431 | 8971 |
| 5167 | 4965 | 5721 |
| 1926 | 1888 | 5461 |
| 2686 | 2165 | 7099 |
| 2802 | 2055 | 5539 |
| 1329 | 4737 | 9413 |
| 1660 | 469 | 1951 |
| 5194 | 9957 | 93g7 |
| 3015 | 5560 | 7983 |
| 4083 | 4239 | 4785 |
| 3348 | 6541 | 8165 |
| 6843 | 6820 | 9803 |
| 7736 | 5291 | 6371 |
| 1880 | 5079 | 9699 |
| 79 | 2033 | 6189 |
| 5874 | 5487 | 7762 |
| 6655 | 9299 | 9075 |
| 6139 | 5381 | 7567 |
| 1406 | 5583 | 6839 |
| 4609 | 3306 | 5513 |
| 319 | 3991 | 6917 |
| 5989 | 8846 | 9569 |
| 4735 | 4497 | 4447 |
| 2814 | 6943 | 8633 |

-continued

| | | |
|---|---|---|
| 5453 | 5702 | 6059 |
| 3708 | 5981 | 9751 |
| 6368 | 5169 | 7333 |
| 3369 | 8002 | 9283 |
| 2628 | 2838 | 5383 |
| 7740 | 5424 | 7645 |
| 2130 | 1372 | 3121 |
| 1608 | 5747 | 8997 |
| 7097 | 7238 | 8399 |
| 2816 | 5125 | 5409 |
| 649 | 1657 | 2835 | is a second half of the check matrix initial value table for the code rate of 93/120.

4. A reception device comprising:
a deinterleaver configured to write data by writing in the forward direction when the modulation scheme is 8PSK and 16APSK and by writing in the reverse direction when the modulation scheme is 32APSK; and
the decoder of claim 3 configured to apply LDPC decoding to data processed by the deinterleaver.

\* \* \* \* \*

UNITED STATES PATENT AND TRADEMARK OFFICE
CERTIFICATE OF CORRECTION

PATENT NO. : 10,020,821 B2  
APPLICATION NO. : 15/035548  
DATED : July 10, 2018  
INVENTOR(S) : Youichi Suzuki et al.

Page 1 of 1

It is certified that error appears in the above-identified patent and that said Letters Patent is hereby corrected as shown below:

On the Title Page

In the OTHER PUBLICATIONS on page 2:
Lines 25-26, please delete "URL : http://www.arib.or.jp/english/html/overview/doc,/6-STD-B44v2_0-E1.pdf" and insert --URL : http://www.arib.or.jp/english/html/overview/doc/6-STD-B44v2_0-E1.pdf--.

In the Specification

Column 13, Line 53, please delete "bit sequence L" and insert --bit sequence $I_i$--.

Column 13, Line 56, please delete "bit sequence L" and insert --bit sequence $I_i$--.

Column 15, Line 14, please delete "symbol $x_i$ are $x_{0,i}$, $x_{1,i}$, $x_{1,i}$, $x_{2,i}$, and $x_{3,i}$," and insert --symbol $x_i$ are $x_{0,i}$, $x_{1,i}$, $x_{2,i}$, and $x_{3,i}$--.

Column 15, Line 29, please delete "$\lambda_{0,i}$, $\lambda_{3,i}$, and $\lambda_{2,i}$, and $\lambda_{4,i}$," and insert --$\lambda_{0,i}$, $\lambda_{1,i}$, $\lambda_{2,i}$, $\lambda_{3,i}$, and $\lambda_{4,i}$--.

Signed and Sealed this  
Second Day of October, 2018

Andrei Iancu  
*Director of the United States Patent and Trademark Office*